United States Patent
Cha

(10) Patent No.: US 10,923,210 B2
(45) Date of Patent: Feb. 16, 2021

(54) MEMORY DEVICE INCLUDING LOAD GENERATOR AND METHOD OF OPERATING THE SAME

(71) Applicant: Samsung Electronics Co., Ltd., Suwon-si (KR)

(72) Inventor: Gyu-hwan Cha, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 68 days.

(21) Appl. No.: 16/192,989

(22) Filed: Nov. 16, 2018

(65) Prior Publication Data

US 2019/0318797 A1 Oct. 17, 2019

(30) Foreign Application Priority Data

Apr. 13, 2018 (KR) .................. 10-2018-0043330

(51) Int. Cl.
| | |
|---|---|
| *G11C 29/36* | (2006.01) |
| *G11C 29/44* | (2006.01) |
| *G11C 29/38* | (2006.01) |
| *G06F 11/273* | (2006.01) |
| *G06F 11/263* | (2006.01) |

(52) U.S. Cl.
CPC .............. *G11C 29/36* (2013.01); *G11C 29/38* (2013.01); *G11C 29/44* (2013.01); *G06F 11/263* (2013.01); *G06F 11/2736* (2013.01)

(58) Field of Classification Search
CPC ..... G11C 29/36; G06F 11/263; G06F 11/2736
See application file for complete search history.

(56) References Cited

U.S. PATENT DOCUMENTS

| | | | |
|---|---|---|---|
| 5,109,348 A | 4/1992 | Pfeiffer et al. | |
| 5,748,640 A * | 5/1998 | Jiang .................. | G06F 11/2236 714/720 |
| 5,777,608 A | 7/1998 | Lipovski et al. | |
| 5,930,497 A * | 7/1999 | Cherian .............. | G06F 11/3428 703/2 |
| 5,991,213 A * | 11/1999 | Cline .................... | G01R 31/30 365/201 |
| 6,247,104 B1 * | 6/2001 | Suzuki ................. | G06F 13/161 711/167 |

(Continued)

FOREIGN PATENT DOCUMENTS

JP 2017-091592 A 5/2017

*Primary Examiner* — Steve N Nguyen
(74) *Attorney, Agent, or Firm* — Harness, Dickey & Pierce, P.L.C.

(57) ABSTRACT

A memory device includes a load generator and a memory controller. The load generator outputs loads for first accesses directed to a memory, irrespective of attributes and characteristics of master devices. The load generator outputs the loads at a constant bandwidth without a change in a bandwidth for outputting the loads. The memory controller receives the loads from the load generator, or receives requests for second accesses directed to the memory from the master devices through a bus. The memory controllers processes the loads such that operations associated with the first accesses are performed in the memory, or processes the requests such that operations associated with the second accesses are performed in the memory. The memory controller processes the loads in a manner which is identical to a manner of processing the requests.

20 Claims, 14 Drawing Sheets

(56) References Cited

U.S. PATENT DOCUMENTS

| | | | |
|---|---|---|---|
| 6,330,697 B1 | 12/2001 | Clinton et al. | |
| 6,341,094 B1 * | 1/2002 | Auracher | G01R 31/318314 |
| | | | 365/189.07 |
| 7,222,273 B2 | 5/2007 | Cho | |
| 7,310,752 B2 | 12/2007 | Jeddeloh | |
| 9,536,626 B2 | 1/2017 | Schoenbom et al. | |
| 2004/0260975 A1 | 12/2004 | Nagura | |
| 2009/0217111 A1 * | 8/2009 | Ito | G06F 11/1068 |
| | | | 714/718 |
| 2014/0157053 A1 * | 6/2014 | Mozak | G11C 29/022 |
| | | | 714/32 |
| 2015/0088437 A1 * | 3/2015 | Lin | G11C 29/023 |
| | | | 702/58 |
| 2017/0149555 A1 | 5/2017 | Cohen et al. | |
| 2020/0027518 A1 * | 1/2020 | Caraher | G11C 29/12015 |

* cited by examiner

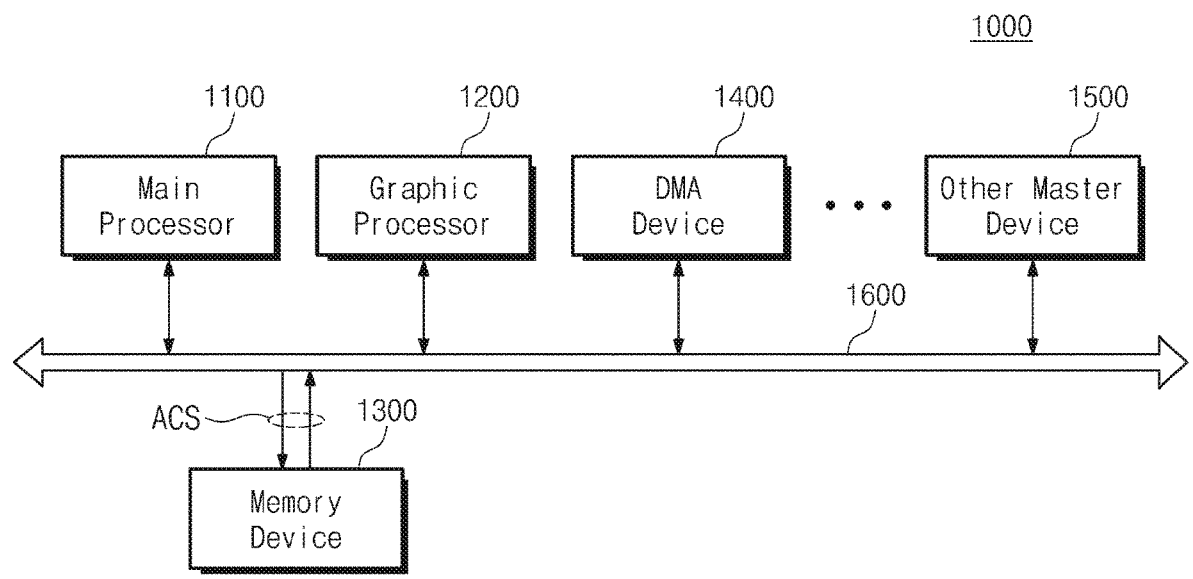

FIG. 7

| Odd Pattern | 0 1 0 1 0 1 ⋯ 0 1 |
| --- | --- |
| | 1 0 1 0 1 0 ⋯ 1 0 |
| Even Pattern | 0 0 0 0 0 0 ⋯ 0 0 |
| | 1 1 1 1 1 1 ⋯ 1 1 |
| Arbitrary Pattern | 1 0 0 1 0 1 ⋯ 0 0 |
| | 0 0 0 1 0 0 ⋯ 0 1 |
| | ⋮ |
| | 0 1 0 0 0 1 ⋯ 1 0 |
| Random Pattern | x x x x x x ⋯ x x |

MEMORY DEVICE INCLUDING LOAD GENERATOR AND METHOD OF OPERATING THE SAME

CROSS-REFERENCE TO RELATED APPLICATIONS

The U.S. non-provisional application claims the benefit of priority under 35 U.S.C. § 119 to Korean Patent Application No. 10-2018-0043330 filed on Apr. 13, 2018, in the Korean Intellectual Property Office, the disclosures of which are incorporated by reference herein in their entireties.

TECHNICAL FIELD

Various example embodiments relate to an electronic device, and more particularly, relate to configurations and/or operations for testing an electronic device.

BACKGROUND

Nowadays, various types of electronic devices are being used. An electronic device performs its own functions according to operations of electronic circuits included in the electronic device, and provides a service to a user. The electronic device may operate solely to provide a service to the user, or may provide a service to the user while communicating with other electronic device.

A memory device is an example of the electronic device. The memory device stores and/or outputs data according to operations of electronic circuits included in the memory device. The memory device provides a service of storing and outputting data in response to a request of other devices.

An electronic device may have characteristics corresponding to requirements which depend on an operation condition. The electronic device may be variously designed to have characteristics which are required in a condition where the electronic device operates. For example, a memory device may have various characteristics (e.g., storage capacity, an operation frequency, a data transfer bandwidth, and/or the like) which are required by a user and/or a system.

Meanwhile, before an electronic device is sold to a user and/or is employed in a system, a test procedure may be performed to test whether the electronic device operates normally while satisfying requirements. During the test procedure, it may be tested whether the electronic device is able to provide a normal service without an error or a failure under an intended condition or an intended scenario. The test of the electronic device may improve satisfaction of a user and reliability of a system. However, resources such as cost and time may be consumed to test the electronic device, and thus performing the test procedure efficiently may be an important issue.

SUMMARY

Various example embodiments of the inventive concepts may provide configurations and/or operations for testing an electronic device (e.g., a memory device, etc.) in a condition which is desired and/or required with regards to operations of the electronic device irrespective of attributes and/or characteristics of master devices.

In some example embodiments, a memory device may include a load generator and a memory controller. The load generator may be configured to output memory test loads for a plurality of first memory accesses directed to at least one memory device. The memory controller may be configured to receive the memory test loads from the load generator, the memory test loads mimicking memory access requests for a plurality of second memory accesses directed to the at least one memory device from a plurality of master devices, and process the memory test loads, the processing the memory test loads including performing memory operations associated with the plurality of first memory accesses on the at least one memory device. The load generator may also be configured to output the memory test loads irrespective of attributes and characteristics of the plurality of master devices. The memory controller may also be configured to process the memory test loads in a manner which is identical to a manner of processing the memory access requests.

In some example embodiments, a memory controller may include a load generator, an interface circuit, and processing circuits, to control a memory device. The load generator may be configured to output memory test loads for a plurality of first memory accesses directed to the memory device. The interface circuit may be configured to receive the memory test loads from the load generator, the memory test loads mimicking memory access requests for a plurality of second memory accesses directed to the memory device from a plurality of master devices. The processing circuits may be configured to receive the memory test loads from the interface circuit, and process the memory test loads such that memory operations associated with the plurality of first memory accesses are performed in the memory device. In response to a test enable signal, the load generator may be configured to output the memory test loads, the memory test loads having a data format equivalent to a data format of the memory access requests from the plurality of master devices. The interface circuit may also be configured to receive the memory test loads from the load generator, without receiving the memory access requests from the plurality of master devices.

In some example embodiments, a method of operating a memory device may include receiving an enable signal for a test of the memory device, generating, by a load generator, memory test loads for memory accesses directed to the memory device based on the enable signal, the generating the memory test loads including outputting the memory test loads at a constant bandwidth rate, and processing, by a memory controller of the memory device, the memory test loads, the processing the memory test loads including performing memory operations associated with memory accesses corresponding to the memory test loads.

According to at least one example embodiment, an electronic device (e.g., a memory device, etc.) may be tested based on loads which are generated irrespective of attributes and/or characteristics of master devices. Accordingly, the electronic device may be tested in a single manner taking into account only a desired attribute and/or requirement (e.g., a maximum bandwidth, etc.) for the electronic device, without variation due to influence of the master devices and various conditions. This may reduce resources, such as cost and time, consumed to test the electronic device, and may improve consistency, efficiency, and/or reliability of device test.

BRIEF DESCRIPTION OF THE DRAWINGS

The above and other objects and features of the inventive concepts will become apparent by describing in detail various example embodiments thereof with reference to the accompanying drawings.

FIG. 1 is a block diagram illustrating an example configuration of an electronic system according to some example embodiments.

FIG. 2 is a diagram illustrating a table for describing a requirement for a memory device of FIG. 1 according to at least one example embodiment.

FIG. 7 is a diagram illustrating a table for describing an example configuration of a load generated by a load generator of FIG. 6 according to at least one example embodiment.

DETAILED DESCRIPTION

Figure 3:
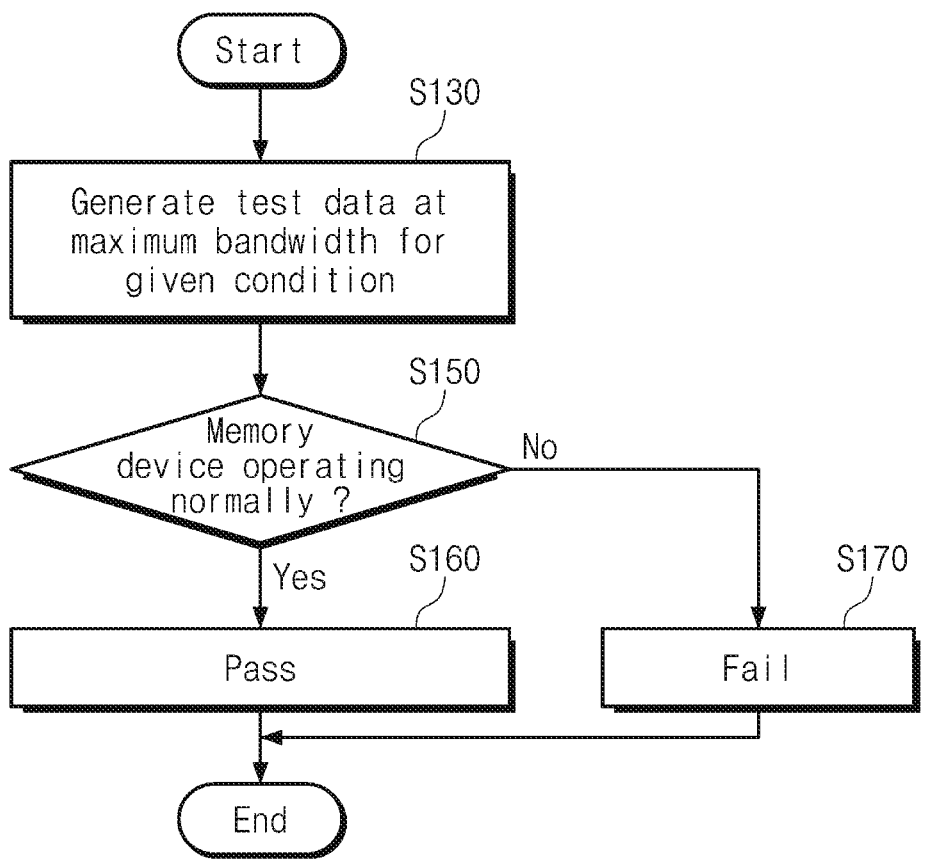
FIG. 3 is a flowchart describing an example method of testing a memory device of FIG. 1 according to at least one example embodiment.

Below, some example embodiments of the inventive concepts will be described in detail and clearly with reference to the accompanying drawings such that one skilled in the art can readily implement the inventive concepts.

FIG. 1 is a block diagram illustrating an example configuration of an electronic system 1000 according to some example embodiments.

The electronic system 1000 may include a main processor 1100, a graphic processor 1200, a memory device 1300, a direct memory access (DMA) device 1400, and/or a bus 1600, etc., but the example embodiments are not limited thereto. For example, the electronic system 1000 may be one of devices or systems such as a desktop computer, a laptop computer, a tablet computer, a smart phone, a wearable device, a video game console, a server, an electric vehicle, home appliances, a medical device, an Internet of Things (IoT) device, a virtual reality (VR) device, an augmented reality (AR) device, and/or the like.

The main processor 1100 may control overall operations of the electronic system 1000. To this end, the main processor 1100 may include one or more processor cores to process various arithmetic/logical operations. Additionally, the main processor 1100 may be implemented as an application processor and/or an application specific processor.

The graphic processor 1200 may process specific types of operations. For example, the graphic processor 1200 may process operations specialized for graphic processing to output image information. For example, the graphic processor 1200 may include parallel processors for processing a large amount of graphic data rapidly.

The memory device 1300 may store data used in an operation of the electronic system 1000. The memory device 1300 may be a working memory or a buffer memory of the electronic system 1000. For example, the memory device 1300 may include a volatile memory such as a static random access memory (SRAM), a dynamic RAM (DRAM), or a synchronous DRAM (SDRAM), etc., and/or a nonvolatile memory such as a phase-change RAM (PRAM), a magneto-resistive RAM (MRAM), a resistive RAM (ReRAM), or a ferroelectric RAM (FRAM), etc.

The DMA device 1400 may access the memory device 1300 to store data in the memory device 1300 and/or to read data stored in the memory device 1300. For example, the DMA device 1400 may perform a DMA operation to access the memory device 1300 without intervention of the main processor 1100. For example, the DMA device 1400 may include a storage device (e.g., a solid state drive (SSD), a hard disk drive, and/or a memory card, etc.), an image processor, a modulator/demodulator (MODEM), and/or the like, which may support the DMA operation.

For example, the memory device 1300 may temporarily store data processed or to be processed by the main processor 1100 and/or the graphic processor 1200. For example, the memory device 1300 may store and output data requested by the DMA device 1400. As such, a device which is able to use the memory device 1300 may be referred to as a master device. For example, each of the main processor 1100, the graphic processor 1200, and the DMA device 1400 may be understood as a master device. The memory device 1300 may be used by a master device which intends to store and/or read data.

Additionally, the electronic system 1000 may further include any type of other master device 1500. The example components described in the inventive concepts are provided to facilitate better understanding, and are not intended to limit the inventive concepts.

The electronic system 1000 may include a plurality of master devices, and the memory device 1300 may be shared by the plurality of master devices. The memory device 1300 may be understood as a shared device. The plurality of master devices may share the shared device to use the shared device together and/or individually. The plurality of master devices may communicate with the shared device through the bus 1600 to exchange data with the shared device and/or to exchange data with one or more of the other master devices.

The bus 1600 may provide a communication path between the components of the electronic system 1000. The components of the electronic system 1000 may exchange data with one another in compliance with a bus format of the bus 1600. For example, the bus format may include one or more of various interface protocols such as universal serial bus (USB), small computer system interface (SCSI), peripheral component interconnect express (PCIe), serial advanced technology attachment (SATA), serial attached SCSI (SAS), nonvolatile memory express (NVMe), universal flash storage (UFS), double data rate (DDR), and/or the like.

When the memory device 1300 is used by the main processor 1100, the graphic processor 1200, the DMA device 1400, and/or the other master device 1500, accesses ACS (e.g., memory accesses and/or memory requests, etc.) directed to the memory device 1300 may occur. The accesses ACS may be associated with operations for storing data in the memory device 1300, and/or operations for reading data stored in the memory device 1300.

Meanwhile, as the plurality of master devices share the memory device 1300, a significantly large amount of accesses ACS may occur. When the number of master devices increases or performance of each master device is improved, the memory device 1300 may have to process a larger amount of accesses ACS. The memory device 1300 may have to satisfy requirements for processing the accesses ACS of a given condition.

FIG. 2 is a diagram illustrating a table for describing a requirement for the memory device 1300 of FIG. 1 according to at least one example embodiment.

For example, the memory device 1300 may have to satisfy requirements for suitably processing requests (e.g., the accesses ACS) of data storing and/or data output received from a plurality of master devices. To this end, the memory device 1300 may have a characteristic of a bandwidth for satisfying the requirements.

The bandwidth may be associated with an amount of data which is input to the memory device 1300 and/or output from the memory device 1300 per unit time. The greater the bandwidth of the memory device 1300, an increase in the amount of data which is input to the memory device 1300 and/or output from the memory device 1300 per unit time is seen (e.g., the memory device 1300 may process a larger amount of accesses ACS).

For example, when the number of lanes and/or channels for data input/output of the memory device 1300 increases, the bandwidth of the memory device 1300 may become greater. However, the number of lanes and/or channels may be limited due to physical limitation (e.g., limitation based on cost, size, protocol limitations, and design, etc.). In this case, the bandwidth of the memory device 1300 may become greater by increasing a frequency of a clock for operating the memory device 1300.

However, as the clock frequency for operating the memory device 1300 becomes higher, the voltage level of a signal transferred in the memory device 1300 may become smaller. In addition, a setup/hold time for sampling a signal becomes insufficient, and/or a timing margin may become smaller. In this case, an operation of the memory device 1300 may become unstable, and/or errors or failures may occur more frequently during the operation of the memory device 1300.

When a voltage level of a signal and/or a timing margin becomes larger to reduce and/or prevent unstable operation of the memory device 1300, the bandwidth of the memory device 1300 may become smaller. A small bandwidth of the memory device 1300 may be insufficient to process requests received from the plurality of master devices. Accordingly, in terms of performance and stability, it may be advantageous to operate the memory device 1300 at the maximum bandwidth under a condition for operating the memory device 1300 stably.

For example, before the memory device 1300 is sold to a user or before the memory device 1300 is equipped in the electronic system 1000, the memory device 1300 and/or a manufacturer, a designer, or a seller of the memory device 1300 may intend to test whether the memory device 1300 operates normally (e.g., stably without any error or failure) at the maximum bandwidth required in a given condition (e.g., desired operating conditions).

In addition to the memory device 1300, a shared device of the electronic system 1000 may have to process accesses for the plurality of master devices. The shared device may be tested whether to operate normally at the maximum bandwidth required in a given condition (e.g., desired operating conditions) of the electronic system 1000 according to at least one example embodiment.

Below, it will be described that the memory device 1300 is an example of the shared device, but the example embodiments of the inventive concepts are not limited thereto. For example, the bus 1600 may also be a shared device shared by a plurality of master devices, and may be tested according to at least one example embodiment. Besides, any type of shared device may be tested according to various example embodiments. The following descriptions will be provided to facilitate better understanding, and it may be readily understood that example embodiments may be employed for other type of device other than the memory device 1300.

FIG. 3 is a flowchart describing an example method of testing the memory device 1300 of FIG. 1 according to at least one example embodiment.

Test data may be generated to test whether the memory device 1300 operates normally (S130). The test data may be generated to exhibit a situation where the memory device 1300 stores and/or outputs data. The memory device 1300 may store and/or output the test data, and thus it may be tested based on the test data whether the memory device 1300 operates normally.

For example, the test data may include arbitrary and/or random data, but is not limited thereto, and the test data may include desired data. For example, the test data may include data which is expected to be generated in a scenario where a user uses the memory device 1300 and/or the electronic system 1000. The example embodiments are not limited thereto, and the test data may be variously changed or modified to include any kind of data suitable to test the memory device 1300.

In the example embodiments, the term test "data" may be used, but may not be intended to limit the example embodiments. The test data may simply include only data, but in some cases, the test data may be provided including various entities such as a command from a master device, a response from the memory device 1300, header information, and/or the like.

The test data may be generated to test whether the memory device 1300 operates normally at the maximum bandwidth required and/or a desired bandwidth for a given condition (e.g., a desired operating condition). Accordingly, the test data may be generated such that the test data is transferred at the maximum bandwidth for a given condition. For example, a given condition of the electronic system 1000 requires and/or desires a bandwidth of 10 MHz/s (e.g., a desired bandwidth and/or a maximum bandwidth, etc.) with regard to the memory device 1300, the test data may be generated to cover the bandwidth of 10 MHz/s. Example configurations associated with generating the test data will be described with reference to FIGS. 4 to 6.

At operation S150, the method may determine whether the memory device 1300 operates normally (S150) based on the test data. When an error or a failure does not occur while the memory device 1300 operates at the maximum bandwidth and/or desired bandwidth based on the test data, it may be determined that the memory device 1300 operates normally (Yes of S150). In this case, the memory device 1300 may pass the test (S160). On the other hand, when an error or a failure occurs while the memory device 1300 operates at the maximum bandwidth and/or desired bandwidth based on the test data, it may be determined that the memory device 1300 does not operate normally (No of S150). In this case, the memory device 1300 may fail the test (S170).

Figure 4:
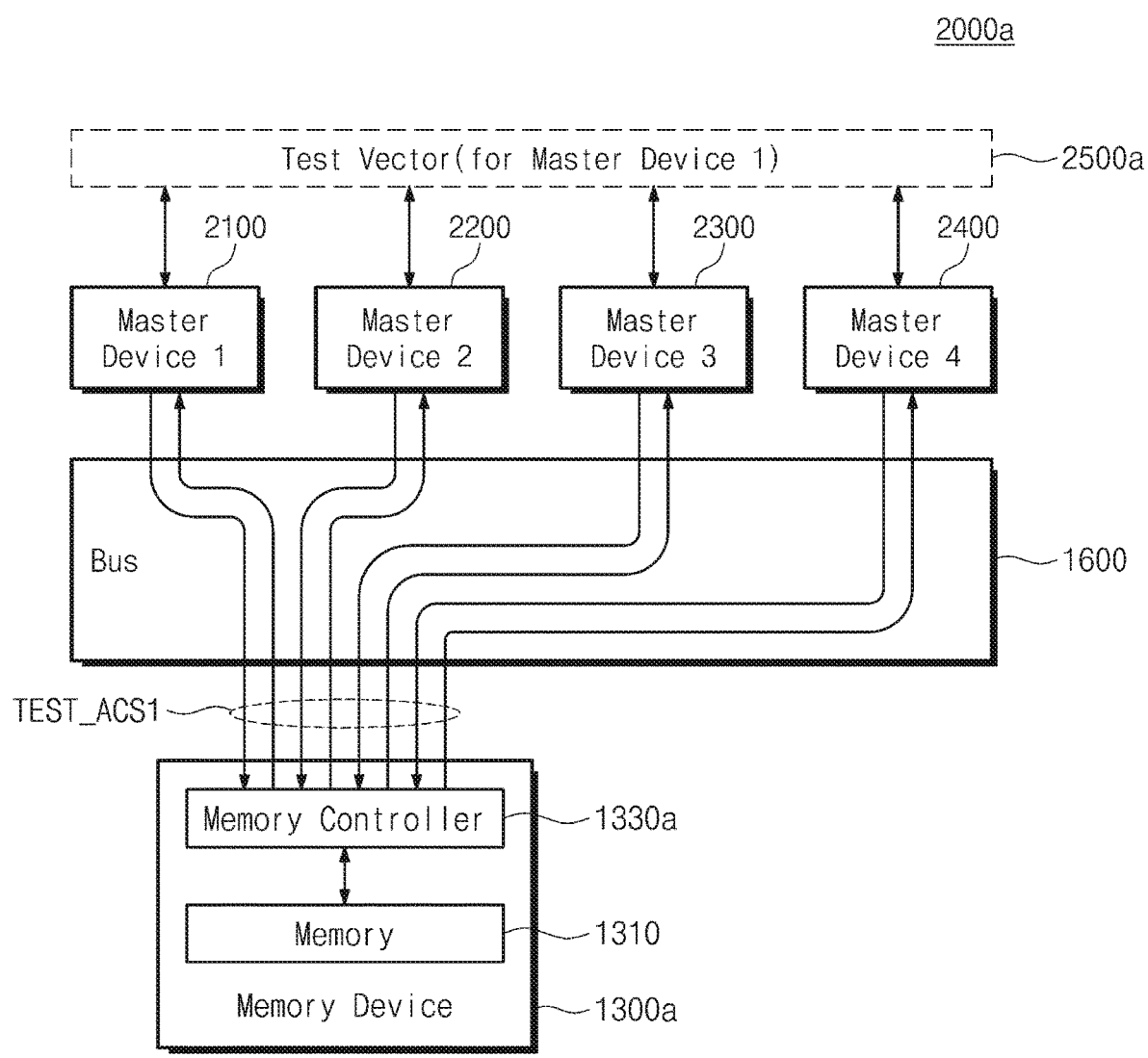
FIGS. 4 to 6 are block diagrams illustrating example configurations of a test system for testing a memory device of FIG. 1 according to some example embodiments.

FIG. 4 is a block diagram illustrating an example configuration of a test system for testing the memory device 1300 of FIG. 1 according to at least one example embodiment. For example, the memory device 1300 of FIG. 1 may include a memory device 1300*a* of FIG. 4, and may be tested using a test system 2000*a* of FIG. 4, but the example embodiments are not limited thereto.

The test system 2000*a* may include master devices 2100, 2200, 2300, and/or 2400, a test vector 2500*a*, the memory device 1300*a*, and/or the bus 1600, etc., but is not limited thereto. Each of the master devices 2100, 2200, 2300, and 2400 may include the main processor 1100, the graphic processor 1200, or the DMA device 1400 of FIG. 1, and/or may include any other type of master device which is able to use the memory device 1300*a*. In addition, the number of master devices may be variously changed or modified according to configurations of the electronic system 1000 and the test system 2000*a*.

The memory device 1300*a* may include a memory 1310 and/or a memory controller 1330*a*, but is not limited thereto. The memory 1310 may include a volatile memory and/or a nonvolatile memory, and may store data. The memory controller 1330*a* may control the memory 1310 such that the memory 1310 stores data and/or outputs the stored data. The memory controller 1330*a* may control the memory 1310 based on requests received from the master devices 2100, 2200, 2300, and 2400, etc., through the bus 1600, but is not limited thereto.

For example, referring to FIGS. 1 and 4, the memory controller 1330*a* may receive requests of the main processor 1100 through the bus 1600. The received requests may direct the accesses ACS to the memory 1310. The memory controller 1330*a* may process the requests of the main processor 1100 such that operations (e.g., a read operation, a write operation, and/or the like) associated with the accesses ACS are performed in the memory 1310.

The test vector 2500*a* may be provided to generate the test data for testing the memory device 1300*a*. The test vector 2500*a* may be a component which operates together with the at least one master device, such as master devices 2100, 2200, 2300, and 2400, such that the one or more master devices 2100, 2200, 2300, and 2400 output the test data. The test vector 2500*a* may be implemented in hardware, software, or a combination thereof to perform operations described in at least one of the example embodiment.

For example, the test vector 2500*a* may include a hardware circuit (e.g., an analog circuit, a logic circuit, and/or the like) configured to control the master devices 2100, 2200, 2300, and 2400, etc., to generate the test data. For example, the test vector 2500*a* may be implemented with a program code which is executed on the master devices 2100, 2200, 2300, and 2400, such that the master devices 2100, 2200, 2300, and 2400 output the test data.

As the test vector 2500*a* operates, the test data may be generated. For example, the test vector 2500*a* may trigger operations of the master devices 2100, 2200, 2300, and 2400 such that transactions are generated to be identical or similar to transactions generated in a scenario where a user uses the memory device 1300*a* and/or the electronic system 1000. The master devices 2100, 2200, 2300, and 2400 may generate the test data in response to the trigger, but is not limited thereto.

Test accesses TEST_ACS1 directed to the memory device 1300*a* from the master devices, e.g., master devices 2100, 2200, 2300, and 2400, may be generated through the bus 1600 based on the test data. The test accesses TEST_ACS1 may be associated with various operations (e.g., a read operation, a write operation, and/or the like) which are performed in the memory device 1300*a* (e.g., in the memory 1310) based on the test data. As the test accesses TEST_ACS1 are generated, the memory device 1300*a* may be tested to determine whether the memory device 1300*a* is operating normally based on the test accesses TEST_ACS1.

For example, the test vector 2500*a* may be designed based on (e.g., taking into account) attributes and characteristics (e.g., a target operation frequency, a physical specification, and/or the like) of the master device 2100. In this case, the test vector 2500*a* may be designed such that the generated test data is transferred at the maximum bandwidth and/or a desired bandwidth for a condition given based on the attributes and the characteristics of the master device 2100. Accordingly, the test data generated based on the test vector 2500*a* may be used to test whether the memory device 1300*a* operates normally at the maximum bandwidth required and/or a desired bandwidth by the master device 2100.

However, the test vector 2500*a* may not be associated with attributes and characteristics of the master devices 2200, 2300, and 2400. In this case, the test data generated based on the test vector 2500*a* may not cover the maximum bandwidths and/or desired bandwidths for conditions given based on the attributes and the characteristics of the master devices 2200, 2300, and 2400.

For example, for a given condition, when an amount of accesses directed to the memory device 1300*a* required and/or desired by the master device 2200 is greater than an amount of accesses to the memory device 1300*a* required and/or desired by the master device 2100, the test data generated based on the test vector 2500*a* may not cover the desired bandwidth and/or maximum bandwidth required by the master device 2200. In this case, even though the memory device 1300*a* operates normally under a condition desired and/or required by the master device 2100, an error or a failure may occur in an operation of the memory device 1300*a* under a condition desired and/or required by the master device 2200.

As such, when the single test vector 2500*a* is used, it may be difficult to consider the attributes and the characteristics of all the master devices 2100, 2200, 2300, and 2400, etc. When the memory device 1300*a* is tested without taking into account the attributes and the characteristics of all the master devices 2100, 2200, 2300, and 2400, etc., an error or a failure may occur in an operation of the memory device 1300*a* while a user actually uses the memory device 1300*a*.

Figure 5:
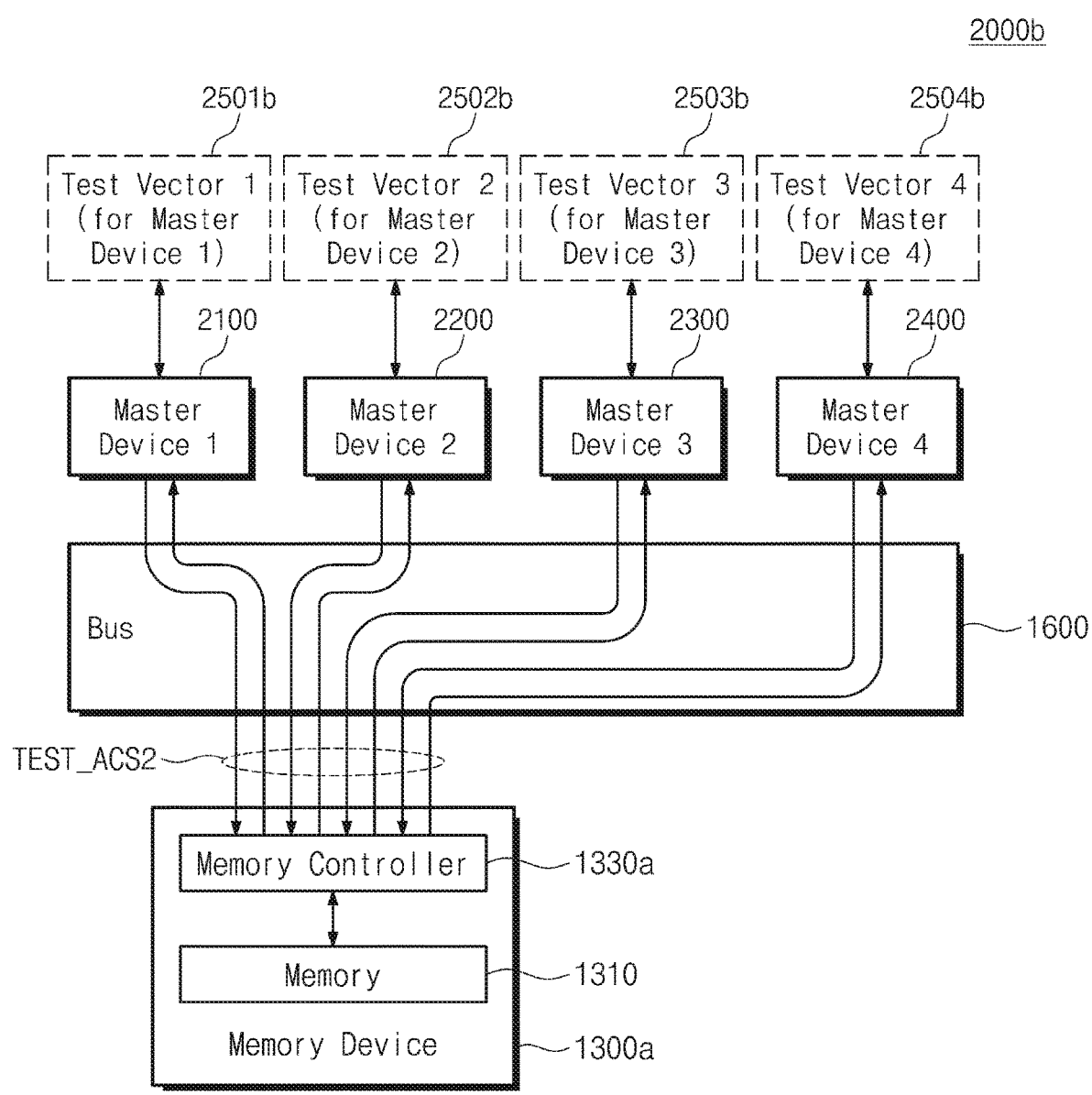

FIG. 5 is a block diagram illustrating an example configuration of a test system for testing the memory device 1300 of FIG. 1 according to at least one example embodiment. For example, the memory device 1300 of FIG. 1 may include the memory device 1300*a* of FIG. 5, and may be tested using a test system 2000*b* of FIG. 5, but is not limited thereto.

The test system 2000*b* may include a plurality of master devices, such as the master devices 2100, 2200, 2300, and 2400, a plurality of test vectors, such as test vectors 2501*b*, 2502*b*, 2503*b*, and 2504*b*, the memory device 1300*a*, and/or the bus 1600, but is not limited thereto. Each of the test vectors 2501*b*, 2502*b*, 2503*b*, and 2504*b* may be provided to generate the test data for testing the memory device 1300*a*. To this end, each of the test vectors 2501*b*, 2502*b*, 2503*b*, and 2504*b* may be implemented in a configuration which is similar to the configuration of the test vector 2500*a* of FIG. 4.

Test accesses TEST_ACS2 directed to the memory device 1300*a* from the plurality of master devices, e.g., master devices 2100, 2200, 2300, and 2400, may be generated through the bus 1600 based on the test data. The test accesses TEST_ACS2 may be associated with various operations (e.g., a read operation, a write operation, and/or the like) which are performed in the memory device 1300a based on the test data. As the test accesses TEST_ACS2 are generated, the memory device 1300a may be tested to determine whether the memory device 1300a operates normally.

For example, the test vectors 2501b, 2502b, 2503b, and 2504b may be designed taking into account the attributes and the characteristics (e.g., a target operation frequency, a physical specification, and/or the like) of the respective master devices 2100, 2200, 2300, and 2400. For example, the test vector 2502b may be designed such that the generated test data is transferred at a desired bandwidth (e.g., the maximum bandwidth, etc.) for a condition given based on the attributes and the characteristics of the master device 2200. In a similar manner, the test vectors 2501b, 2503b, and 2504b may be designed such that the generated test data is transferred at a desired bandwidth and/or the maximum bandwidths for conditions given based on the attributes and the characteristics of the respective master devices 2100, 2300, and 2400.

Accordingly, the test data generated based on the test vector 2502b may be used to test whether the memory device 1300a operates normally at a desired bandwidth and/or the maximum bandwidth required and/or desired by the master device 2200. Similarly, the test data generated based on the test vectors 2501b, 2503b, and 2504b may be used to test whether the memory device 1300a operates normally at desired bandwidths and/or the maximum bandwidths required by one or more of the plurality of master devices, such as the master devices 2100, 2300, and 2400.

Unlike the test system 2000a of FIG. 4, the test system 2000b of FIG. 5 may employ a test vector suitable for a condition required by each master device. The test data generated based on the test vectors, e.g., test vectors 2501b, 2502b, 2503b, and 2504b, may cover the desired bandwidth and/or the maximum bandwidths for the conditions given based on the attributes and the characteristics of the respective master devices 2100, 2200, 2300, and 2400, etc. As such, when the plurality of test vectors 2501b, 2502b, 2503b, and 2504b are used, the attributes and the characteristics of all the master devices 2100, 2200, 2300, and 2400 may be considered.

However, depending on the implementation (e.g., a kind, a type, a purpose, a specification, performance, and/or the like) of the electronic system 1000 or the test system 2000b, attributes, characteristics, a kind, and a type of the master devices 2100, 2200, 2300, and 2400 may be variously changed and/or modified. Accordingly, the test vectors 2501b, 2502b, 2503b, and 2504b may also have to be variously designed to consider various master devices. This may increase a time and a cost consumed to develop and design a test vector.

In addition, there may be limitation in designing test vectors which are able to cover all situations, due to diversity of the implementation of the electronic system 1000 or the test system 2000b. Moreover, the test data may be differently generated depending on attributes, characteristics, a kind, and a type of the master devices 2100, 2200, 2300, and 2400, and thus consistency, efficiency, and reliability of device test may be degraded.

Figure 6:
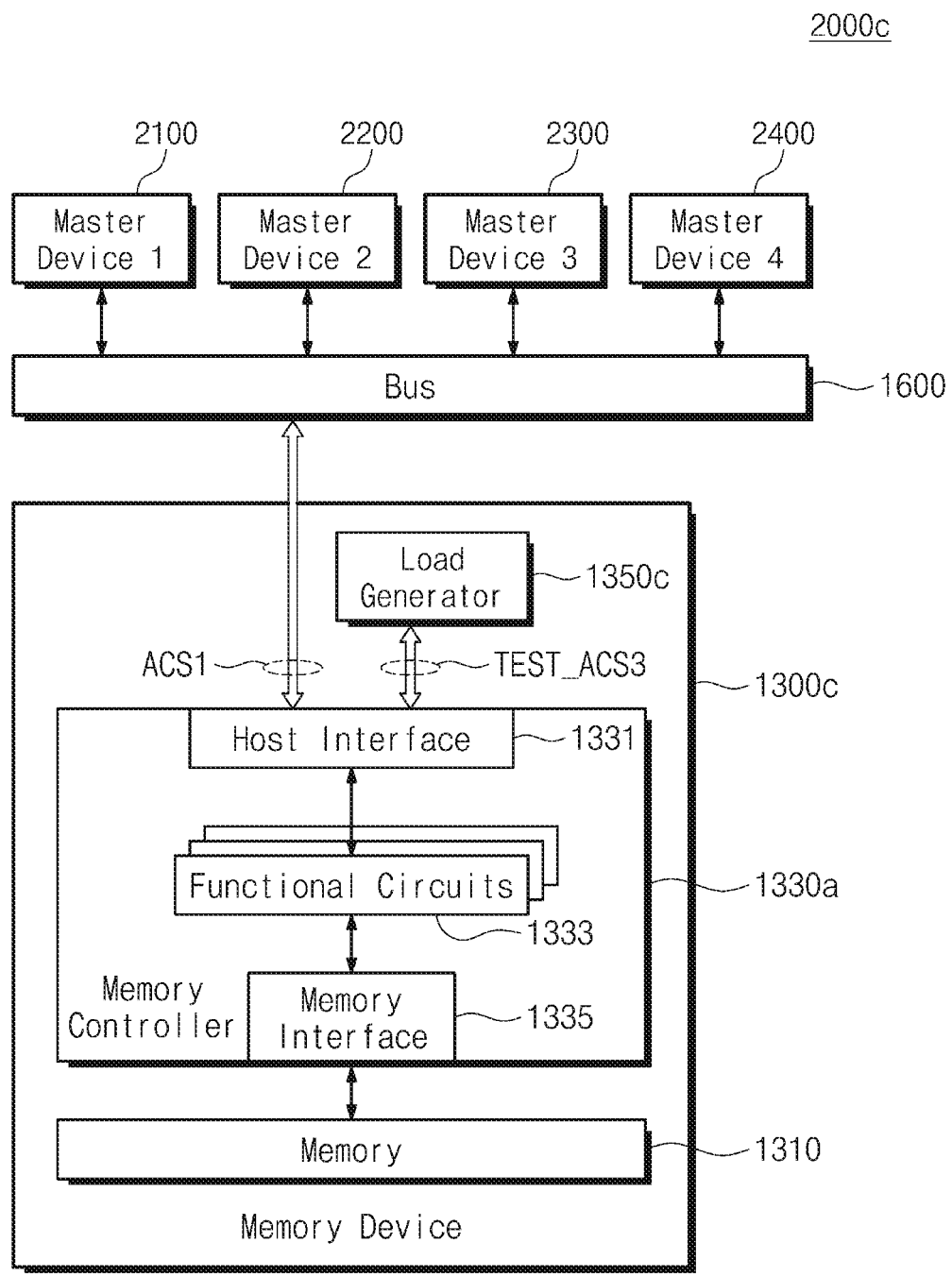

FIG. 6 is a block diagram illustrating an example configuration of a test system for testing the memory device 1300 of FIG. 1 according to at least one example embodiment. For example, the memory device 1300 of FIG. 1 may include a memory device 1300c of FIG. 6, and may be tested using a test system 2000c of FIG. 6, but is not limited thereto.

The test system 2000c may include a plurality of master devices, such as the master devices 2100, 2200, 2300, and 2400, the memory device 1300c, and/or the bus 1600, but is not limited thereto. The memory device 1300c may include the memory 1310, the memory controller 1330a, and/or a load generator 1350c, but is not limited thereto. The memory controller 1330a may include a host interface circuit 1331, functional circuits 1333, and/or a memory interface circuit 1335, but is not limited thereto.

The memory controller 1330a may control the memory 1310 based on requests received from the plurality of master devices, e.g., master devices 2100, 2200, 2300, and 2400, etc., through the bus 1600. The received requests may direct accesses ACS1 to the memory 1310. Operations (e.g., a read operation, a write operation, and/or the like) requested by the master devices 2100, 2200, 2300, and 2400 may be performed in the memory 1310 based on the accesses ACS1. Herein, the accesses ACS1 may be for a general transaction (e.g., a transaction intended by a user and/or a master device) with the memory device 1300c, not for a test of the memory device 1300c.

The host interface circuit 1331 may facilitate communication between one or more of the master devices 2100, 2200, 2300, and 2400 and the memory device 1300c. The host interface circuit 1331 may receive requests for the accesses ACS1 directed to the memory 1310 from the bus 1600. The host interface circuit 1331 may change the format of the received requests (e.g., memory requests) to a format recognizable by the memory controller 1330a, and/or may change format of data processed in the memory controller 1330a to format recognizable by the master devices 2100, 2200, 2300, and 2400.

The functional circuits 1333 may perform various operations on data to be stored in the memory 1310 and/or data output from the memory 1310. For example, the functional circuits 1333 may receive requests of the master devices 2100, 2200, 2300, and 2400 from the host interface circuit 1331, and may process the requests such that operations associated with the accesses ACS1 are performed in the memory 1310. In this regard, the functional circuits 1333 may also be referred to as processing circuits. For example, the functional circuits 1333 may include various hardware circuits such as a data conversion circuit, an error detection and correction circuit, a processor, and/or the like.

The memory interface circuit 1335 may facilitate communication between the memory 1310 and the memory controller 1330a. The memory interface circuit 1335 may communicate with the memory 1310 such that the memory 1310 stores and/or outputs data depending on operations of the functional circuits 1333. The memory interface circuit 1335 may provide the memory 1310 with data of format recognizable by the memory 1310, and/or may change format of data output from the memory 1310 to format recognizable by the memory controller 1330a.

The load generator 1350c may generate loads (e.g., memory test loads, etc.) to test whether the memory device 1300c operates normally at a desired bandwidth and/or the maximum bandwidth required in a given condition. In order words, the load generator 1350c may generate loads that mimic memory access requests transmitted by one or more master devices to a shared memory device, e.g., memory device 1300c. The load generator 1350c may include hardware circuits configured to generate the loads. The loads generated by the load generator 1350c may be used as the test data for testing the memory device 1300c. The loads may include any kind of data suitable to test the memory device 1300c.

Test accesses TEST_ACS3 directed to the memory 1310 may be generated based on the loads. The test accesses TEST_ACS3 may be associated with various operations (e.g., a read operation, a write operation, and/or the like) which are performed in the memory device 1300c (e.g., in the memory 1310) based on the loads. The operations associated with the test accesses TEST_ACS3 may be performed to test the memory device 1300c irrespective of the master devices 2100, 2200, 2300, and 2400. As the test accesses TEST_ACS3 are generated, it may be tested whether the memory device 1300c operates normally.

For example, a communication path for the accesses ACS1 may include (or may be through) the bus 1600, and a communication path for the test accesses TEST_ACS3 may not include (or may not be through) the bus 1600. In this example, the communication path for the test accesses TEST_ACS3 may be separate from the communication path for the accesses ACS1. The load generator 1350c may be independent of the plurality of master devices, e.g., master devices 2100, 2200, 2300, and 2400, but the example embodiments are not limited thereto, and in some example embodiments, the load generator 1350c may be integrated into one or more of the master devices.

The host interface circuit 1331 of the memory controller 1330a may receive the loads from the load generator 1350c. The functional circuits 1333 of the memory controller 1330a may receive the loads from the host interface circuit 1331. The functional circuits 1333 of the memory controller 1330a may perform various operations to process the loads such that operations associated with the test accesses TEST_ACS3 are performed in the memory 1310.

FIG. 6 illustrates that the load generator 1350c is included in the memory device 1300c according to at least one example embodiment, but the example embodiments are not limited thereto. In some example embodiments, the load generator 1350c may be provided outside the memory device 1300c. Additionally, the load generator 1350c may be provided inside the memory controller 1330a.

Unlike the test systems 2000a and 2000b of FIGS. 4 and 5, the test system 2000c of FIG. 6 may employ the load generator 1350c instead of a test vector. The load generator 1350c may be implemented for the memory device 1300c (e.g., inside the memory device 1300c) independently of the master devices 2100, 2200, 2300, and 2400. Accordingly, the load generator 1350c may generate and output the loads irrespective of the attributes and the characteristics of the master devices 2100, 2200, 2300, and 2400, but the example embodiments are not limited thereto.

The load generator 1350c may be designed such that the generated loads are transferred at a desired bandwidth and/or the maximum bandwidth for a given condition. For example, the load generator 1350c may output the loads at a constant bandwidth (e.g., at the maximum bandwidth required with regard to operations of the memory device 1300c, etc.) without a change in a bandwidth for outputting the loads. Accordingly, the loads generated by the load generator 1350c may be used to test whether the memory device 1300c operates normally at the desired bandwidth and/or the maximum bandwidth required with regard to the operations of the memory device 1300c.

In the test system 2000c, the memory device 1300c may be tested under a condition which is irrespective of the attributes and the characteristics of one or more of the master devices 2100, 2200, 2300, and 2400. Accordingly, the memory device 1300c may be tested taking into account only a requirement (e.g., the maximum bandwidth, etc.) for the memory device 1300c, without variation due to the influence of the master devices 2100, 2200, 2300, and 2400 and various conditions. That is, irrespective of attributes, characteristics, a kind, and a type of the master devices 2100, 2200, 2300, and 2400, the memory device 1300c may be tested in a single manner (e.g., in a manner of considering only the maximum bandwidth of the memory device 1300c, etc.).

In the test system 2000c, the memory device 1300c may be tested using only the load generator 1350c. Accordingly, resources (e.g., a time, a cost, and/or the like) consumed to develop and design test vectors taking into account the attributes and the characteristics of the master devices 2100, 2200, 2300, and 2400 may be saved. In addition, as the memory device 1300c is tested in the single manner, consistency, efficiency, and reliability of device test may be improved.

The memory controller 1330a may receive and/or selectively receive the requests from the master devices 2100, 2200, 2300, and 2400 through the host interface circuit 1331 and/or the loads from the load generator 1350c through the host interface circuit 1331. Accordingly, in the functional circuits 1333 of the memory controller 1330a, an operation of receiving and/or processing the loads from the load generator 1350c may be exclusive to an operation of receiving and/or processing the requests from the master devices 2100, 2200, 2300, and 2400 (e.g., the loads may be processed at a different time interval from a time interval where the requests are processed).

For example, the load generator 1350c may not generate the loads in response to a test disable signal for the memory device 1300c. The memory controller 1330a may not receive the loads from the load generator 1350c through the host interface circuit 1331, and may receive only the requests from the master devices 2100, 2200, 2300, and 2400 through the host interface circuit 1331. Accordingly, the memory device 1300c may operate based on the accesses ACS1.

On the other hand, the load generator 1350c may generate and output the loads in response to a test enable signal for the memory device 1300c. The memory controller 1330a may receive only the loads from the load generator 1350c through the host interface circuit 1331, without receiving the requests from the master devices 2100, 2200, 2300, and 2400 through the host interface circuit 1331. Accordingly, the memory device 1300c may be tested based on the test accesses TEST_ACS3.

Format of the loads generated by the load generator 1350c may be equivalent to format of the requests received from the master devices 2100, 2200, 2300, and 2400. The "equivalent" format may mean that the format of the loads is completely or substantially the same as the format of the requests.

Due to the equivalent format, when the memory controller 1330a receives the loads from the load generator 1350c, the memory controller 1330a may recognize the load as if the loads are received from the master devices 2100, 2200, 2300, and 2400. The functional circuits 1333 of the memory controller 1330a may recognize and process the loads received from the load generator 1350c in a manner which is identical to a manner of recognizing and processing the requests received from the master devices 2100, 2200, 2300, and 2400. Accordingly, operations corresponding to the loads or the test accesses TEST_ACS3 may be performed in the memory 1310.

When the memory controller 1330a receives the loads from the load generator 1350c, the memory controller 1330a may process each of the loads only once. The test system 2000c may not be for searching for a condition suitable to process the requests of the master devices 2100, 2200, 2300, and 2400 by iteratively processing a specific load, but the test system 2000c may be for testing whether the memory device 1300c operates normally in a specific condition (e.g., at the maximum bandwidth, etc.). Accordingly, the memory controller 1330a may process each load only once without iteration.

Each of the loads generated by the load generator 1350c may include a data pattern for testing the memory device 1300c based on the test accesses TEST_ACS3, under a condition of a desired bandwidth and/or the maximum bandwidth required with regard to operations of the memory device 1300c.

FIG. 7 is a diagram illustrating a table for describing an example configuration of a load generated by the load generator 1350c of FIG. 6 according to at least one example embodiment.

For example, each load may include a data pattern which is composed of bits of data, and each bit a logic value. For example, the data pattern may include an odd pattern which is generated such that bits of different logic values are alternately arranged, an even pattern which is generated such that bits of the same logic value are successively arranged, an arbitrary pattern which is generated including arbitrary bits, and/or the like. In some cases, the data pattern may include a random pattern which is generated such that each bit has a random logic value.

In some example embodiments, the load generator 1350c may include a memory element or circuit to store logic values of a data pattern to be output as a load, and may output loads based on the stored data pattern. In some example embodiments, the load generator 1350c may include a voltage generation circuit to provide a signal level corresponding to a specific logic value. In some example embodiments, the load generator 1350c may include a randomization circuit to provide a bit of a random logic value based on a seed value.

The load generator 1350c may include a buffer circuit to output bits of a data pattern. The load generator 1350c may output bits constituting one load simultaneously or in parallel, in response to a clock.

In some example embodiments, the load generator 1350c may output loads of a single data pattern. In some example embodiments, the load generator 1350c may output loads of variable data patterns (e.g., a plurality of different data patterns). In this case, the load generator 1350c may include a selection circuit (e.g., a switch, a multiplexer, and/or the like) such that a load of a data pattern selected from among various data patterns is output.

The above example embodiments are provided to facilitate better understanding, and are not intended to limit the inventive concepts. A data pattern of a load may be variously changed or modified to be recognizable by the memory controller 1330a such that an intended operation is performed in the memory 1310. In addition, a configuration of the load generator 1350c and a data pattern of a load may be variously changed or modified to be suitable to test the memory device 1300c.

Figure 8:
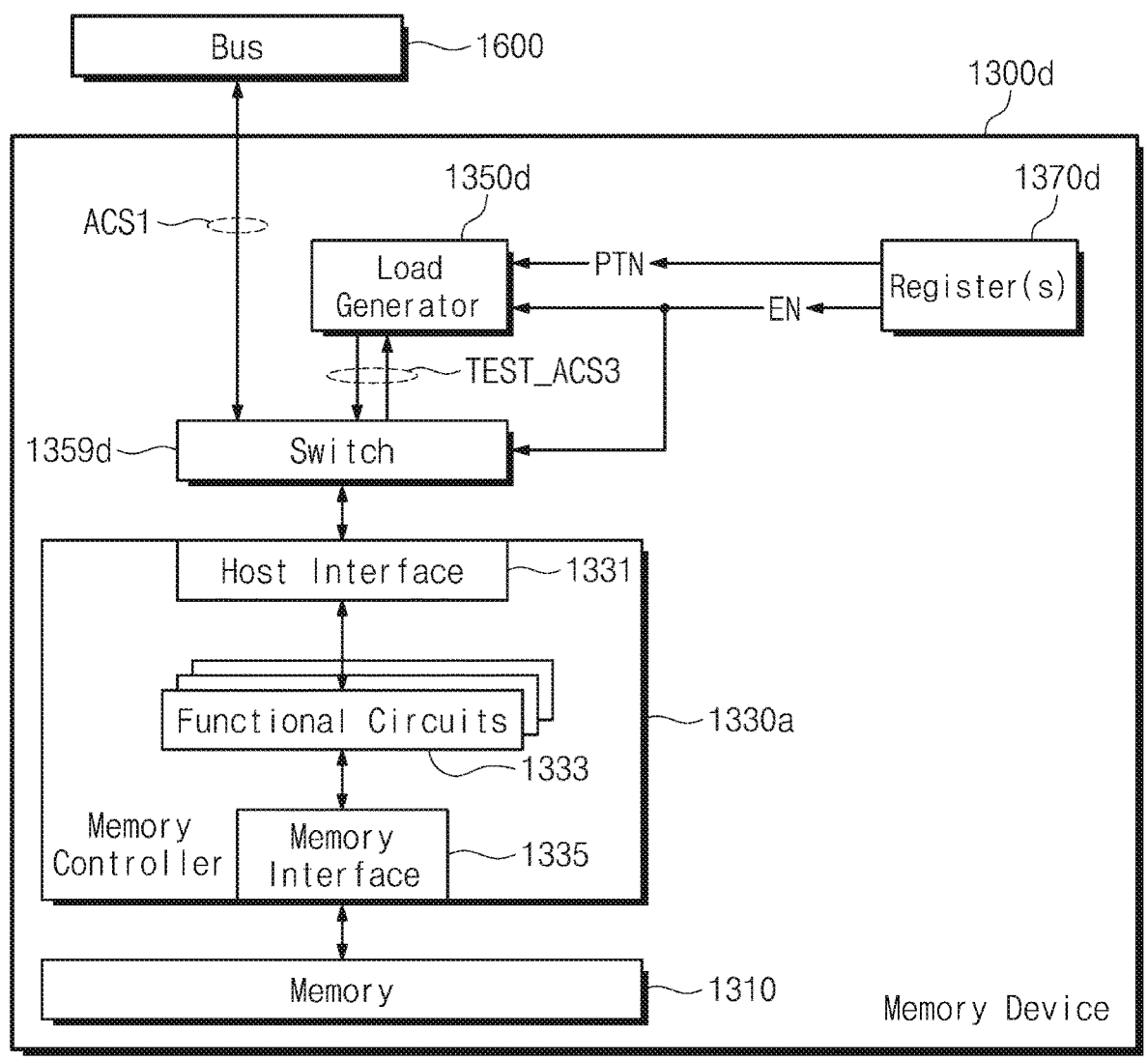
FIG. 8 is a block diagram illustrating an example configuration of a memory device of FIG. 6 according to at least one example embodiment.

FIG. 8 is a block diagram illustrating an example configuration of the memory device 1300c of FIG. 6 according to at least one example embodiment. For example, the memory device 1300c of FIG. 6 may include a memory device 1300d of FIG. 8.

The memory device 1300d may include the memory 1310, the memory controller 1330a, a load generator 1350d, a switch circuit 1359d, and one or more registers 1370d. The memory controller 1330a, the host interface circuit 1331, the functional circuits 1333, and the memory interface circuit 1335 have been described with reference to FIG. 6.

A configuration of the load generator 1350d may include a configuration which is substantially identical or similar to the configuration of the load generator 1350c of FIG. 6, but is not limited thereto. An operation of the load generator 1350d may include an operation which is substantially identical or similar to the operation of the load generator 1350c of FIG. 6, but is not limited thereto.

The switch circuit 1359d may selectively provide a communication path for the accesses ACS1 between the bus 1600 and the memory controller 1330a and/or a communication path for the test accesses TEST_ACS3 between the load generator 1350d and the memory controller 1330a. The switch circuit 1359d may switch the two communication paths such that one of the two communication paths is selectively provided.

For example, the switch circuit 1359d may selectively transfer the requests of a plurality of master devices, e.g., the master devices 2100, 2200, 2300, and 2400, from the bus 1600 to the memory controller 1330a and/or the loads from the load generator 1350d to the memory controller 1330a. Accordingly, the host interface circuit 1331 of the memory controller 1330a may selectively receive the requests from one or more of the master devices, e.g., the master devices 2100, 2200, 2300, and 2400, and/or the loads from the load generator 1350d through the switch circuit 1359d.

The register 1370d may store various setting values associated with operations of the load generator 1350d. The load generator 1350d may operate and/or may be disabled based on the setting values stored in the register 1370d. For example, a manufacturer, a designer, or a seller, etc., of the memory device 1300d and/or the electronic system 1000 may control (e.g., change or manipulate) a setting value of the register 1370d to test the memory device 1300d. The number of the registers 1370d may be variously changed or modified depending on a configuration of the setting values.

In some example embodiments, the register 1370d may store an enable value indicating whether to enable a test of the memory device 1300d. The register 1370d may output an enable signal EN to select test enable or test disable of the memory device 1300d based on the enable value.

For example, when the enable value indicates the test disable of the memory device 1300d, the register 1370d may not output the enable signal EN. When the enable signal EN is not output, the load generator 1350d may not operate (e.g., may not generate/output the loads). In addition, the switch circuit 1359d may provide the communication path for the accesses ACS1 between the bus 1600 and the memory controller 1330a, and may block the communication path between the load generator 1350d and the memory controller 1330a.

Accordingly, in response to the test disable condition, the memory controller 1330a may receive the requests from the master devices 2100, 2200, 2300, and 2400 through the bus 1600 and the switch circuit 1359d, and operations directed by the accesses ACS1 may be performed in the memory 1310. In this case, the test of the memory device 1300d may not be performed, and general transactions may be provided between the master devices 2100, 2200, 2300, and 2400 and the memory device 1300d.

On the other hand, for example, when the enable value indicates the test enable condition of the memory device

1300d, the register 1370d may output the enable signal EN. In response to the enable signal EN, the load generator 1350d may operate (e.g., may generate loads), and thus an operation of outputting the loads may be enabled. In addition, the switch circuit 1359d may provide the communication path for the test accesses TEST_ACS3 between the load generator 1350d and the memory controller 1330a, and may block the communication path between the bus 1600 and the memory controller 1330a.

Accordingly, in response to the test enable signal, an operation of transferring the loads to the memory controller 1330a through the switch circuit 1359d may be enabled. The memory controller 1330a may receive the loads generated by the load generator 1350d, and operations directed by the test accesses TEST_ACS3 may be performed in the memory 1310. In this case, it may be tested whether the memory device 1300d operates normally (e.g., without any error or failure while operating) under a given condition (e.g., at the maximum bandwidth, etc.). Meanwhile, a general transaction with the master devices 2100, 2200, 2300, and 2400 may not be provided.

In some example embodiments, the register 1370d may store a pattern control value indicating a data pattern to be output as a load. The register 1370d may output a pattern control signal PTN based on the pattern control value, to select a data pattern to be output as a load.

For example, as described with reference to FIG. 7, the load generator 1350d may output a load of a data pattern which is selected from among various data patterns. The load generator 1350d may output loads of which each includes a selected data pattern, in response to the pattern control signal PTN. Based on the pattern control signal PTN, data patterns included in the loads may be uniquely selected or may vary over time.

Figure 9:
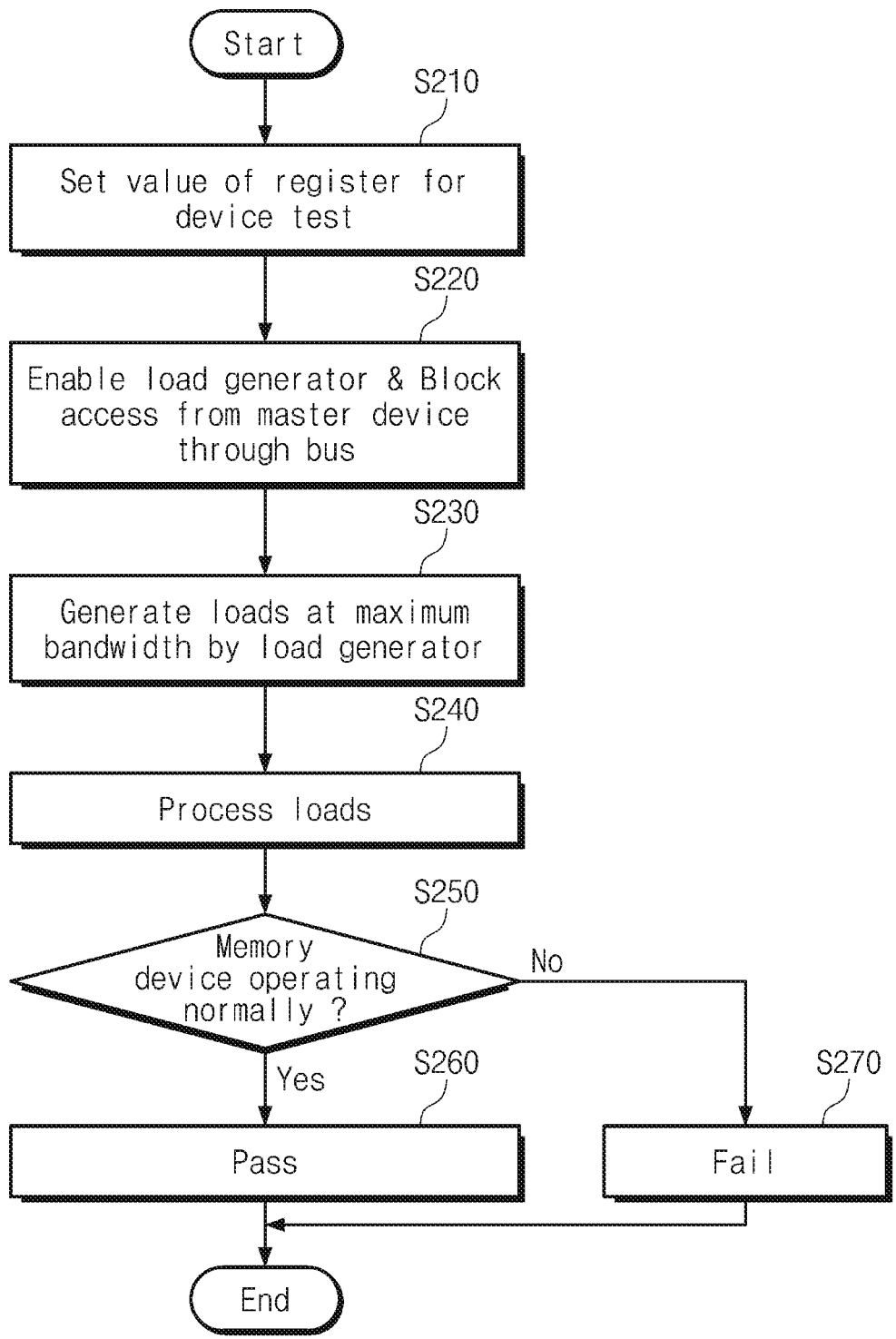
FIG. 9 is a flowchart describing an example method of testing a memory device of FIG. 8 according to at least one example embodiment.

FIG. 9 is a flowchart describing an example method of testing the memory device 1300d of FIG. 8 according to at least one example embodiment. The memory device 1300d may operate according to the example method of FIG. 9.

A manufacturer, a designer, or a seller, etc., of the memory device 1300d and/or the electronic system 1000 may intend to test the memory device 1300d. In this case, the manufacturer, the designer, or the seller, etc., of the memory device 1300d and/or the electronic system 1000 may control (e.g., input or change) the setting values of the register 1370d for test (S210). For example, the enable value of the register 1370d may be controlled to indicate the test enable. Accordingly, the register 1370d may output the enable signal EN.

Some components of the memory device 1300d may receive the enable signal EN. The load generator 1350d may be enabled in response to the enable signal EN. In addition, the switch circuit 1359d may provide the communication path between the load generator 1350d and the memory controller 1330a. Meanwhile, in response to the enable signal EN, an access from a plurality of master devices, such as the master devices 2100, 2200, 2300, and 2400, etc., to the memory device 1300d (e.g., the memory 1310) through the bus 1600 may be blocked (S220).

The enabled load generator 1350d may generate and output the loads (S230). In example embodiments, the load generator 1350d may output the loads at a constant bandwidth, without a change in a bandwidth for outputting the loads, but the example embodiments are not limited thereto. For example, the load generator 1350d may output the loads at a desired bandwidth and/or the maximum bandwidth required with regard to operations of the memory device 1300d. The loads generated by the load generator 1350d may be transferred to the memory controller 1330a through the switch circuit 1359d.

In some example embodiments, the load generator 1350d may receive the pattern control signal PTN. The load generator 1350d may output the loads based on a data pattern indicated by the pattern control signal PTN.

The memory controller 1330a may receive the loads through the host interface circuit 1331. The memory controller 1330a may process the loads by the functional circuits 1333 such that operations (e.g., a read operation, a write operation, and/or the like) which are directed by the received loads and are associated with the test accesses TEST_ACS3 are performed in the memory 1310 (S240).

As the loads are processed, it may be monitored whether the memory device 1300d operates normally under a given condition (e.g., at the maximum bandwidth, etc.) (S250). For example, a master device (e.g., the main processor 1100) may monitor an operation of the memory device 1300d and may generate a monitoring result. For example, the memory device 1300d may monitor its operation by itself and may generate a monitoring result. For example, a user of the memory device 1300d and/or the electronic system 1000 may monitor an operation of the memory device 1300d, or may refer to the generated monitoring result.

When an error or a failure does not occur while the memory device 1300d operates at a desired bandwidth and/or the maximum bandwidth, it may be determined that the memory device 1300d operates normally (Yes of S250). In this case, the memory device 1300d may pass the test (S260). The memory device 1300d which has passed the test may be sold to a user or may be equipped in the electronic system 1000.

On the other hand, when an error or a failure occurs while the memory device 1300d operates at the desired bandwidth and/or the maximum bandwidth, it may be determined that the memory device 1300d does not operate normally (No of S250). In this case, the memory device 1300d may fail in the test (S270). The memory device 1300d which has failed in the test may be debugged such that an error or a failure would not occur, may be fixed or improved to have a better characteristic, or may be replaced with other memory device which is able to satisfy requirements (e.g., which is able to operate normally at the desired and/or maximum bandwidth).

Figure 10:
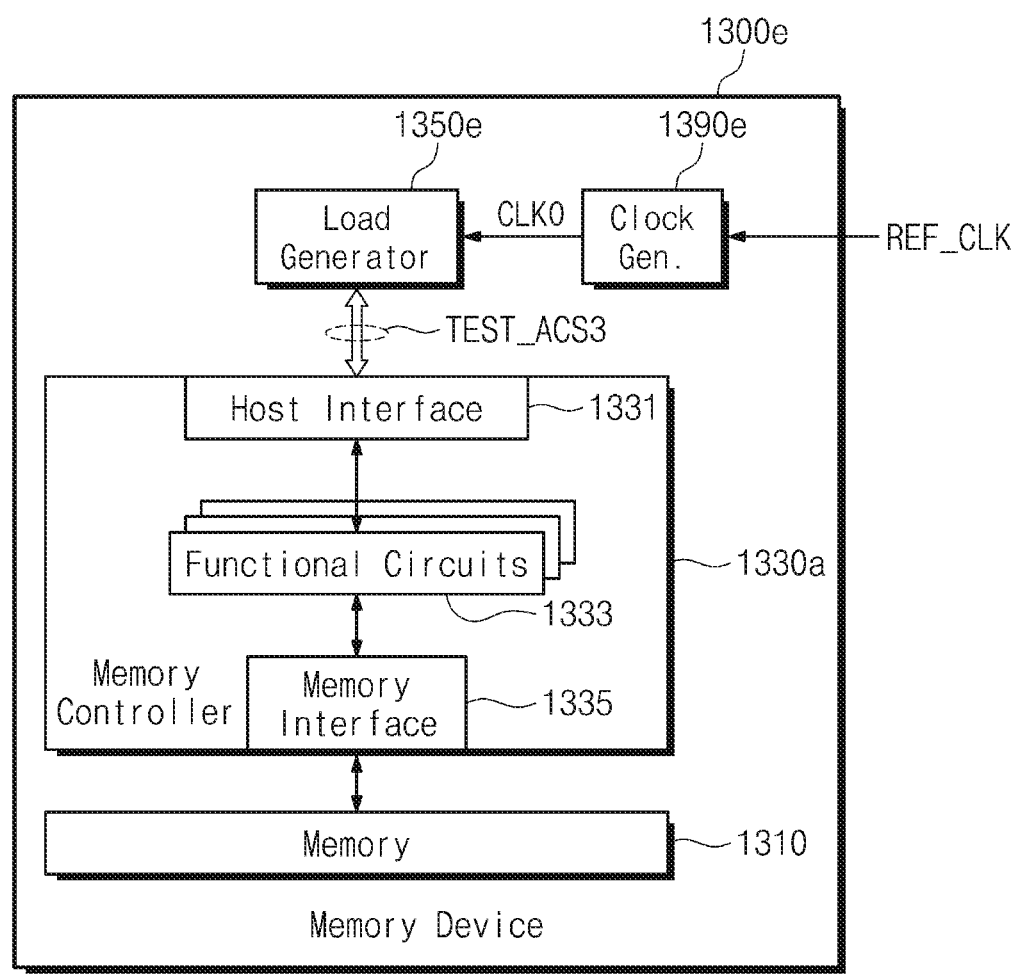
FIGS. 10 to 12 are block diagrams illustrating example configurations associated with a memory device of FIG. 6 according to some example embodiments.

FIG. 10 is a block diagram illustrating an example configuration associated with the memory device 1300c of FIG. 6 according to at least one example embodiment. For example, the memory device 1300c of FIG. 6 may include a memory device 1300e of FIG. 10.

The memory device 1300e may include the memory 1310, the memory controller 1330a, a load generator 1350e, and/or a clock generator 1390e, etc., but is not limited thereto. The memory controller 1330a, the host interface circuit 1331, the functional circuits 1333, and/or the memory interface circuit 1335 have been described with reference to FIG. 6.

A configuration of the load generator 1350e may include a configuration which is substantially identical or similar to the configuration of the load generator 1350c of FIG. 6 or the load generator 1350d of FIG. 8, but is not limited thereto. An operation of the load generator 1350e may include an operation which is substantially identical or similar to the operation of the load generator 1350c of FIG. 6 or the load generator 1350d of FIG. 8, but is not limited thereto.

The clock generator 1390e may output a clock CLK0 for operating the load generator 1350e. The load generator 1350e may output the loads in synchronization with the clock CLK0. The clock generator 1390e may receive a reference clock REF_CLK from a clock source inside the electronic system 1000 (or inside the memory device 1300e), and may generate the clock CLK0 based on the reference clock REF_CLK. To this end, for example, the clock generator 1390e may include a circuit, which is able to output a clock of a specific frequency, such as a phase locked loop (PLL) circuit, etc.

In the example embodiment illustrated in FIG. 10, the load generator 1350e may operate in response to the independent clock CLK0. In this case, a frequency of the clock CLK0 may be flexibly selected to correspond to an intended maximum bandwidth and/or a desired bandwidth.

Figure 11:
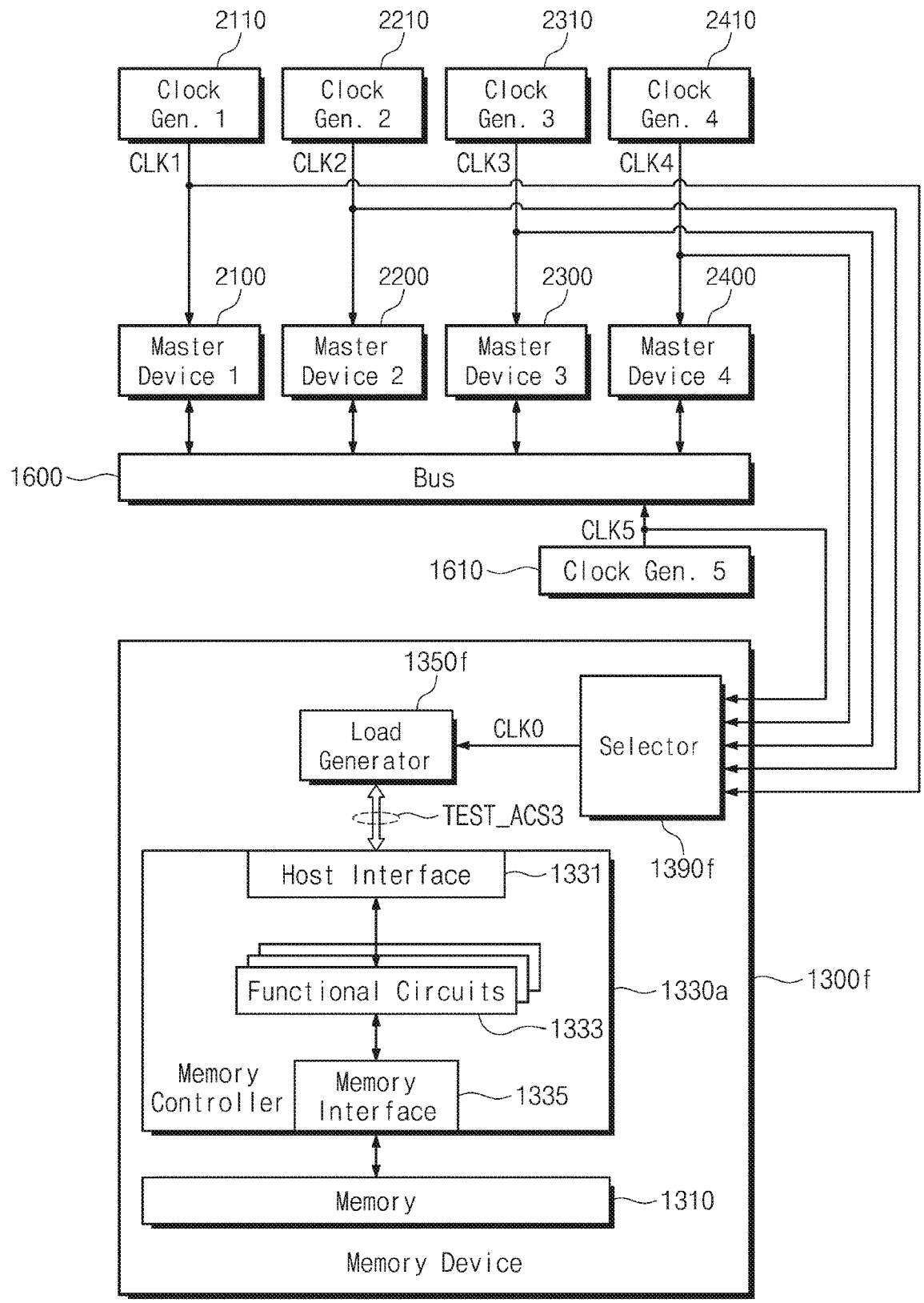

FIG. 11 is a block diagram illustrating an example configuration associated with the memory device 1300c of FIG. 6 according to at least one example embodiment. For example, the memory device 1300c of FIG. 6 may include a memory device 1300f of FIG. 11, but is not limited thereto.

For example, the electronic system 1000 of FIG. 1 or the test system 2000c of FIG. 6 may further include a plurality of clock generators, such as clock generators 2110, 2210, 2310, 2410, and 1610. The clock generators 2110, 2210, 2310, 2410, and 1610 may output a plurality of clock signals (e.g., clocks), such as clocks CLK1, CLK2, CLK3, CLK4, and CLK5 respectively. For example, the clock generators 2110, 2210, 2310, 2410, and 1610 may output the clocks CLK1, CLK2, CLK3, CLK4, and CLK5 based on a stable reference clock. The clocks CLK1, CLK2, CLK3, CLK4, and CLK5 may be provided to operate one or more of the master devices 2100, 2200, 2300, and 2400 and the bus 1600 respectively.

The memory device 1300f may include the memory 1310, the memory controller 1330a, a load generator 1350f, and/or a selector 1390f, but is not limited thereto. The memory controller 1330a, the host interface circuit 1331, the functional circuits 1333, and the memory interface circuit 1335 have been described with reference to FIG. 6, but are not limited thereto.

A configuration of the load generator 1350f may include a configuration which is substantially identical or similar to the configuration of the load generator 1350c of FIG. 6 or the load generator 1350d of FIG. 8, but is not limited thereto. An operation of the load generator 1350f may include an operation which is substantially identical or similar to the operation of the load generator 1350c of FIG. 6 or the load generator 1350d of FIG. 8, but is not limited thereto.

For example, the selector 1390f may receive the clocks CLK1, CLK2, CLK3, CLK4, and CLK5. The selector 1390f may output one clock selected from among the clocks CLK1, CLK2, CLK3, CLK4, and CLK5 as the clock CLK0. For example, the selector 1390f may include a circuit, which is able to select some of a plurality of inputs, such as a switch, a multiplexer, and/or the like.

The clock CLK0 may be provided to the load generator 1350f. The load generator 1350f may output the loads in synchronization with the clock CLK0, but is not limited thereto. Accordingly, the load generator 1350f may output the loads in response to one clock among the clocks CLK1, CLK2, CLK3, CLK4, and CLK5 for operating the master devices 2100, 2200, 2300, and 2400 and/or the bus 1600.

For example, a frequency of the one clock selected by the selector 1390f from among the clocks CLK1, CLK2, CLK3, CLK4, and CLK5 may be the highest frequency among frequencies of the clocks CLK1, CLK2, CLK3, CLK4, and CLK5, but is not limited thereto. The clock CLK0 may correspond to a clock, which has the highest frequency, from among the clocks CLK1, CLK2, CLK3, CLK4, and CLK5. The selector 1390f may output the clock CLK0 having a high frequency such that the load generator 1350f outputs the loads under a condition of a desired bandwidth and/or the maximum bandwidth.

In the example embodiment illustrated in FIG. 11, the load generator 1350f may operate based on one clock among the existing clocks CLK1, CLK2, CLK3, CLK4, and CLK5. In this case, a separate clock generator for the load generator 1350f may not be provided, and a configuration of the memory device 1300f may be simplified.

Figure 12:
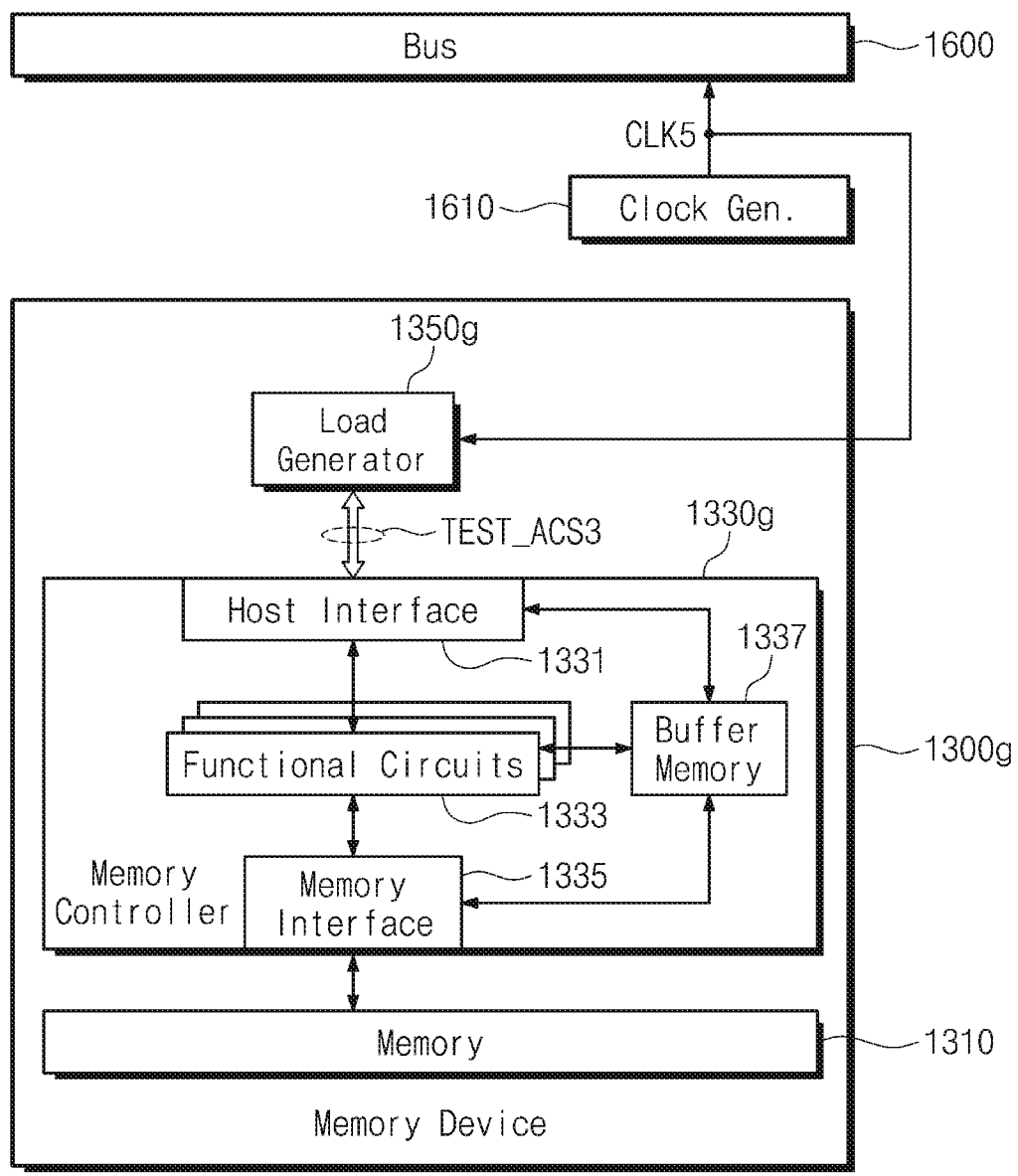

FIG. 12 is a block diagram illustrating an example configuration associated with the memory device 1300c of FIG. 6 according to at least one example embodiment. For example, the memory device 1300c of FIG. 6 may include a memory device 1300g of FIG. 12.

For example, the electronic system 1000 of FIG. 1 or the test system 2000c of FIG. 6 may further include the clock generator 1610. The clock generator 1610 may generate and output the clock CLK5 based on a stable reference clock. The clock CLK5 may be provided to operate the bus 1600.

The memory device 1300g may include the memory 1310, a memory controller 1330g, and/or a load generator 1350g, etc. A configuration of the load generator 1350g may include a configuration which is substantially identical or similar to the configuration of the load generator 1350c of FIG. 6 or the load generator 1350d of FIG. 8, but is not limited thereto. An operation of the load generator 1350g may include an operation which is substantially identical or similar to the operation of the load generator 1350c of FIG. 6 or the load generator 1350d of FIG. 8, but is not limited thereto.

A configuration of the memory controller 1330g may include a configuration which is substantially identical or similar to the configuration of the memory controller 1330a of FIG. 6, but is not limited thereto. An operation of the memory controller 1330g may include an operation which is substantially identical or similar to the operation of the memory controller 1330a of FIG. 6, but is not limited thereto. The memory controller 1330g may include the host interface circuit 1331, the functional circuits 1333, the memory interface circuit 1335, and/or a buffer memory 1337, etc. The host interface circuit 1331, the functional circuits 1333, and the memory interface circuit 1335 have been described with reference to FIG. 6.

The buffer memory 1337 may temporarily store data which is used and/or transferred by the memory controller 1330g. For example, the buffer memory 1337 may store data processed or to be processed by the functional circuits 1333, and may store data transferred through the host interface circuit 1331 and/or the memory interface circuit 1335. To this end, for example, the buffer memory 1337 may include a volatile memory such as an SRAM, a DRAM, or an SDRAM, etc., and/or a nonvolatile memory such as a PRAM, an MRAM, a ReRAM, or an FRAM, etc.

The load generator 1350g may receive the clock CLK5 for operating the bus 1600. The load generator 1350g may output the loads in synchronization with the clock CLK5. In the example embodiment illustrated in FIG. 12, the load generator 1350g may operate in response to the existing clock CLK5. In this case, a separate clock generator for the load generator 1350g may not be provided, and a configuration of the memory device 1300g may be simplified.

Meanwhile, a frequency of the clock CLK5 for operating the bus 1600 may be somewhat lower than frequencies of other clocks of the electronic system 1000 or the test system 2000c, but is not limited thereto. For example, the frequency of the clock CLK5 may be lower than a frequency of a clock for operating the memory device 1300g (e.g., the memory controller 1330g and/or the memory 1310). In this case, the load generator 1350g which operates based on the clock CLK5 may not cover the desired bandwidth and/or the maximum bandwidth required with regard to operations of the memory device 1300g. Example embodiments to be described with reference to FIGS. 13 and 14 may be provided to cover a condition of a desired bandwidth and/or the maximum bandwidth despite the low frequency of the clock CLK5.

Figure 13:
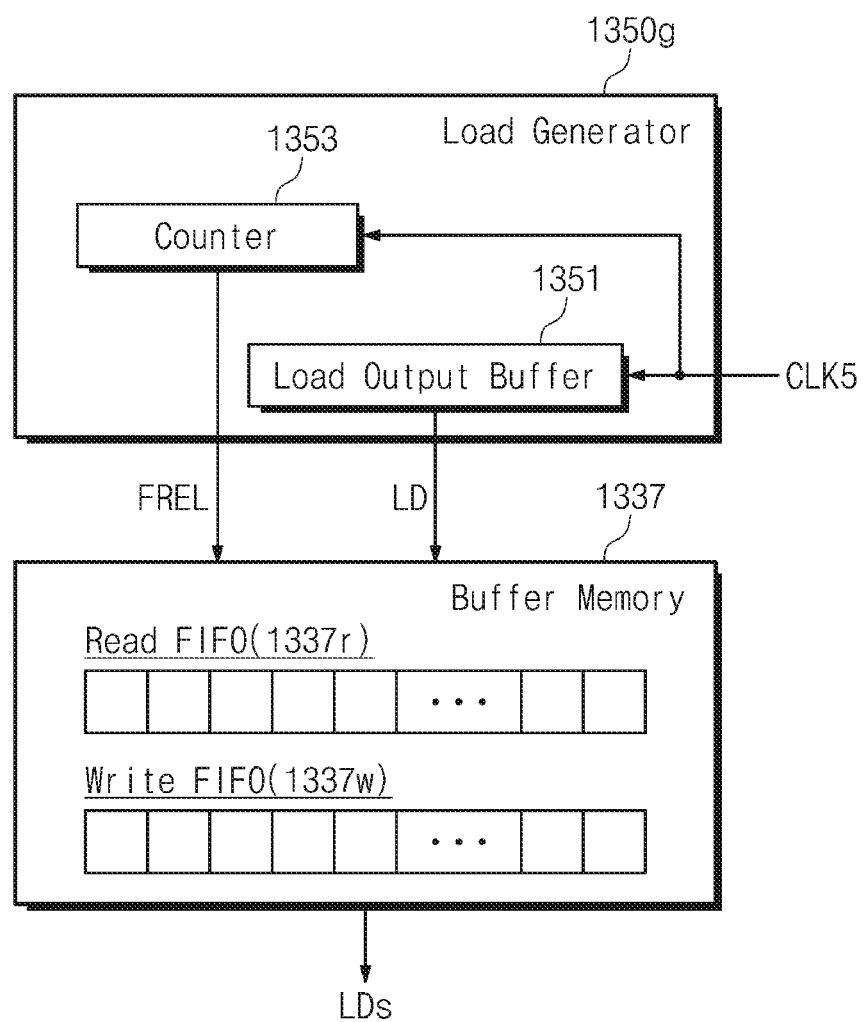
FIG. 13 is a block diagram illustrating an example configuration included in a memory device of FIG. 12 according to at least one example embodiment.

FIG. 13 is a block diagram illustrating an example configuration included in the memory device 1300g of FIG. 12 according to at least one example embodiment.

In some example embodiments, the load generator 1350g may include a load output buffer 1351 and/or a counter 1353, etc. In some example embodiments, the buffer memory 1337 may include a read first-in-first-out (FIFO) region 1337r and/or a write FIFO region 1337w, but is not limited thereto. The read FIFO region 1337r and the write FIFO region 1337w may be allocated on memory regions included in the buffer memory 1337.

Herein, the term "FIFO" is used, but a data structure managed in the buffer memory 1337 may be variously changed to any other manner other than the FIFO manner. Further, the example configuration of FIG. 13 is provided to facilitate better understanding, and is not intended to limit the inventive concepts.

The load output buffer 1351 of the enabled load generator 1350g may output a load LD in synchronization with the clock CLK5. The output load LD may include a unique data pattern, or may be variable to include a data pattern indicated by the pattern control signal PTN. In response to the clock CLK5, the load output buffer 1351 may output a plurality of loads LDs.

The output load LD may be stored (e.g., buffered) in the buffer memory 1337. For example, when the output load LD is associated with a read operation, the output load LD may be buffered in the read FIFO region 1337r. For example, when the output load LD is associated with a write operation, the output load LD may be buffered in the write FIFO region 1337w. In such a manner, the buffer memory 1337 of the memory controller 1330g may sequentially store (e.g., store according to an order of being received) data values (e.g., logic values of bits) corresponding to the plurality of loads LDs, based on the clock CLK5, but is not limited thereto.

Meanwhile, the read FIFO region 1337r and the write FIFO region 1337w may be configured to store data values as much as a reference data size. Until data values are accumulated as much as the reference data size, the read FIFO region 1337r and the write FIFO region 1337w of the buffer memory 1337 may store the data values corresponding to the plurality of loads LDs without outputting the stored data values.

For example, a size of each load LD and the reference data size may be determined in advance (e.g., in advance before the memory device 1300g is tested). In this case, the number of cycles of the clock CLK5 for fully filling the read FIFO region 1337r and the write FIFO region 1337w may also be determined. For example, when the size of each load LD is "S" and the reference data size is "10S", ten (10) loads LDs may be output in response to ten (10) cycles of the clock CLK5, and the read FIFO region 1337r and the write FIFO region 1337w may be fully filled with the ten loads LDs.

The counter 1353 of the enabled load generator 1350g may manage a count value. The counter 1353 may increase the count value in response to the clock CLK5. Accordingly, whenever each of the data values corresponding to the plurality of loads LDs is stored (e.g., buffered) in the buffer memory 1337, the counter 1353 may increase the count value.

When the count value reaches a reference value, the counter 1353 may output a release signal FREL. The reference value may be associated with the reference data size. For example, when the size of each load LD is "S" and the reference data size is "10S", the reference value may be ten (10). The reference value may correspond to the number of cycles of the clock CLK5 for fully filling the read FIFO region 1337r and the write FIFO region 1337w. In this case, when data values are accumulated in the read FIFO region 1337r and the write FIFO region 1337w of the buffer memory 1337 as much as the reference data size, the buffer memory 1337 may receive the release signal FREL from the load generator 1350g.

In response to the release signal FREL, the buffer memory 1337 may output the accumulated data values of the reference data size which have been stored in the read FIFO region 1337r and the write FIFO region 1337w of the buffer memory 1337. The output data values may constitute the loads LDs. The buffer memory 1337 may sequentially output (e.g., output according to an order of being stored) the data values corresponding to the loads LDs. As the count value reaches the reference value and the loads LDs are output in response to the release signal FREL, the counter 1353 may be reset (e.g., to have an initial value before the count value is increased).

When the data values buffered in the buffer memory 1337 are accumulated as much as the reference data size, the memory controller 1330g may process the loads LDs in response to the release signal FREL. The memory controller 1330g may process the loads LD sin response to a clock for operating the memory controller 1330g. For example, the loads LDs may be provided to the functional circuits 1333 directly or through the host interface circuit 1331, and the functional circuits 1333 may process the loads LDs. For example, the frequency of the clock CLK5 may be lower than a frequency of the clock for operating the memory controller 1330g, but is not limited thereto.

Figure 14:
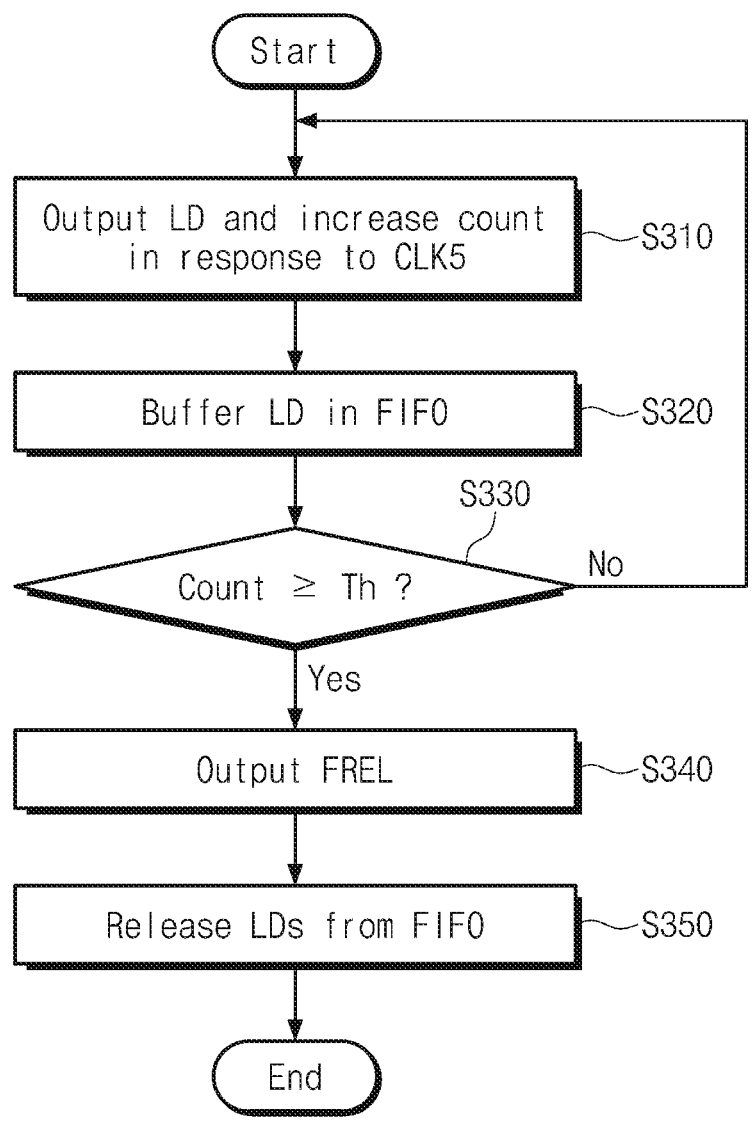
FIG. 14 is a flowchart describing an example operation of a memory device of FIGS. 12 and 13 according to some example embodiments.

FIG. 14 is a flowchart describing an example operation of the memory device 1300g of FIGS. 12 and 13 according to at least one example embodiment.

The enabled load generator 1350g may output the load LD and may increase the count value in response to the clock CLK5 (S310). The buffer memory 1337 may buffer the load LD in the read FIFO region 1337r and/or the write FIFO region 1337w (S320). When the count value does not reach a reference value Th (No of S330), the load generator 1350g may output a next load LD and may increase the count value.

On the other hand, when the count value reaches the reference value Th (Yes of S330), the enabled load generator 1350g may output the release signal FREL (S340). The buffer memory 1337 may output the loads LD corresponding to the reference data size, in response to the release signal FREL (S350).

That is, the memory controller 1330g may receive all at once the loads LDs which are accumulated corresponding to the reference data size in the buffer memory 1337, instead of processing each load LD in response to every cycle of the clock CLK5. In this case, it may seem as if the frequency of the test accesses TEST_ACS3 per a unit time increases. Accordingly, even though the frequency of the clock CLK5 is low, the desired bandwidth and/or the maximum bandwidth required with regard to operations of the memory device 1300g may be implemented. When the size of each load LD and the reference data size are suitably selected according to a frequency of the clock CLK5, a condition of the desired bandwidth and/or the maximum bandwidth may also be suitably obtained.

Figure 15:
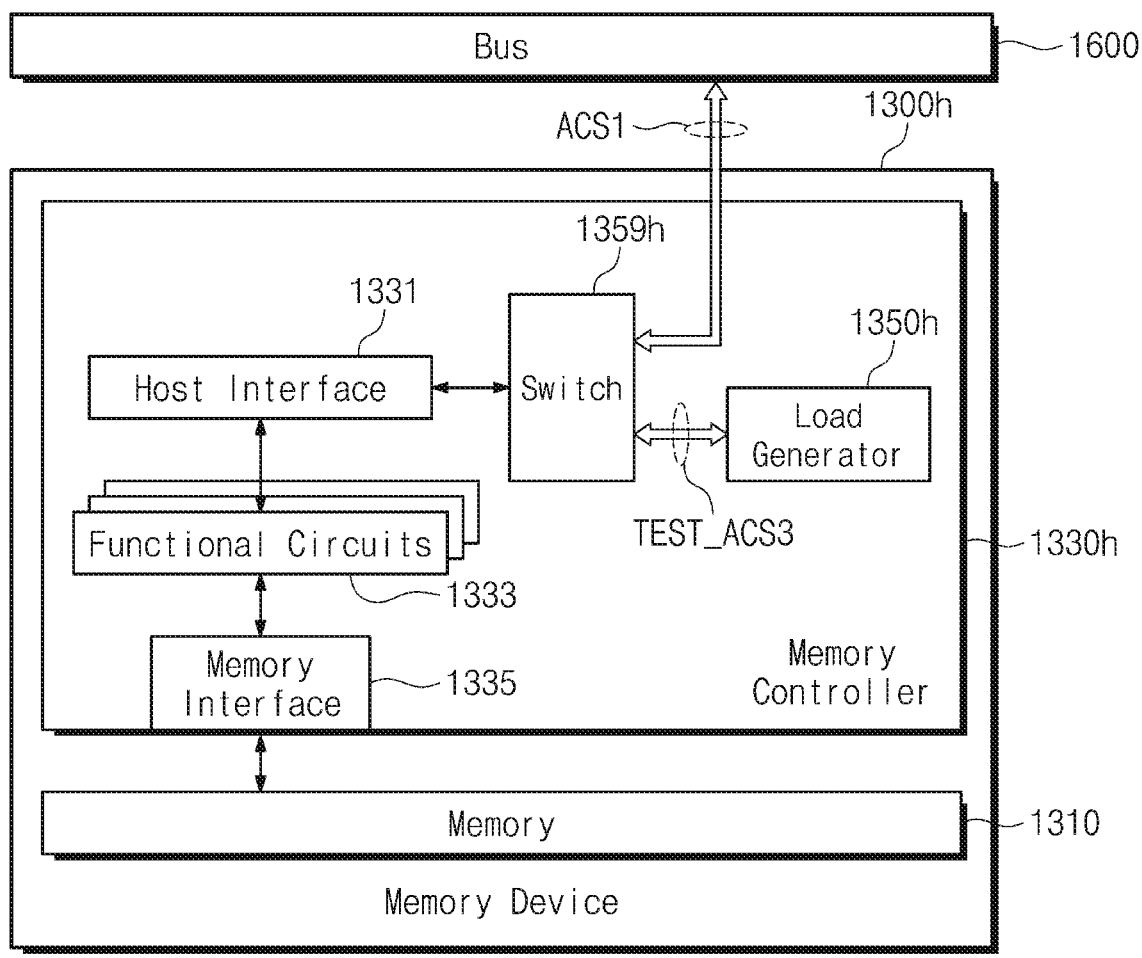
FIG. 15 is a block diagram illustrating an example configuration of a memory device for testing a memory device of FIG. 1 according to at least one example embodiment.

FIG. 15 is a block diagram illustrating an example configuration of a memory device 1300h for testing the memory device 1300 of FIG. 1 according to at least one example embodiment. For example, the memory device 1300 of FIG. 1 may include the memory device 1300h of FIG. 15.

The memory device 1300h may include the memory 1310 and/or a memory controller 1330h, etc. The memory controller 1330h may include the host interface circuit 1331, the functional circuits 1333, the memory interface circuit 1335, a load generator 1350h, and/or a switch circuit 1359h, etc. The host interface circuit 1331, the functional circuits 1333, and the memory interface circuit 1335 have been described with reference to FIG. 6.

The load generator 1350h and the switch circuit 1359h may correspond to the load generator 1350d and the switch circuit 1359d of FIG. 8 respectively, but are not limited thereto. For example, the load generator 1350h may output the loads for the test accesses TEST_ACS3 directed to the memory 1310. For example, the switch circuit 1359h may selectively provide the accesses ACS1 directed to the memory 1310 from master devices through the bus 1600 or the test accesses TEST_ACS3 directed to the memory 1310 from the load generator 1350h.

Comparing FIG. 15 to FIG. 8, the load generator 1350h and the switch circuit 1359h may be provided inside the memory controller 1330h. For example, when other signals which are communicated inside the memory controller 1330h are required to control an operation of the load generator 1350h or to test the memory device 1300h, signal routing may become easy by implementing the load generator 1350h inside the memory controller 1330h. As such, it may be readily understood that the various example embodiments of the inventive concepts may be variously changed or modified without being limited by the above descriptions.

The above descriptions are intended to provide example configurations and operations for implementing the inventive concepts. The scope and spirit of the inventive concepts may include implementations which are obtained by simply changing or modifying the above example embodiments, in addition to the above-described example embodiments. Also, the scope and spirit of the inventive concepts may include implementations which are accomplished by easily changing or modifying the above-described example embodiments in the future.

What is claimed is:

1. A memory device comprising:
a load generator configured to generate a plurality of memory test loads for a plurality of first memory accesses directed to at least one memory device, the plurality of memory test loads mimicking a plurality of memory access requests for a plurality of second memory accesses from a plurality of master devices of at least two different device types directed to the at least one memory device, each of the plurality of memory test loads being generated based on a respective device type of the corresponding master device of the plurality of master devices; and
a memory controller configured to,
receive the memory test loads from the load generator, and
process the memory test loads, the processing the memory test loads including performing memory operations associated with the plurality of first memory accesses on the at least one memory device, wherein the memory controller is further configured to process the memory test loads in a manner which is identical to a manner of processing the memory access requests.

2. The memory device of claim 1, wherein
each of the memory test loads of the plurality of the memory test loads includes a data pattern for testing the at least one memory device based on the plurality of first memory accesses using a desired bandwidth with regard to the at least one memory device; and
a data format of the memory test loads is based on a data format of the memory access requests output from the plurality of master devices.

3. The memory device of claim 1, further comprising:
a switch circuit configured to selectively transfer the memory test loads from the load generator or the memory access requests from the plurality of master devices from a bus to the memory controller.

4. The memory device of claim 3, further comprising:
a register configured to output an enable signal to the load generator and the switch circuit, wherein
the load generator is further configured to output the memory test loads based on the enable signal, and
the switch circuit is further configured to transfer the memory test loads to the memory controller based on the enable signal.

5. The memory device of claim 4, wherein
the register is further configured to output a pattern control signal to the load generator, the pattern control signal including a desired data pattern; and
the load generator is further configured to output the memory test loads based on the desired data pattern.

6. The memory device of claim 1, wherein the load generator is further configured to output the memory test loads in response to a first clock among a plurality of clocks for operating the plurality of master devices and a bus.

7. The memory device of claim 6, wherein a frequency of the first clock is the highest among frequencies of the plurality of clocks.

8. The memory device of claim 1, wherein the load generator is further configured to output the memory test loads in response to a bus clock for operating a bus.

9. The memory device of claim 8, wherein a frequency of the bus clock is lower than a frequency of a memory controller clock for operating the memory controller.

10. The memory device of claim 9, wherein
the memory controller comprises a buffer memory configured to sequentially store and output data values which correspond to the memory test loads;
the buffer memory is further configured to store the data values until a data size of the data values reach a reference data size; and
in response to the data size of the data values stored in the buffer memory reaching the reference data size,
the buffer memory is further configured to output the stored data values of the reference data size in response to a release signal received from the load generator, and
the memory controller is further configured to process the memory test loads corresponding to the output data values in response to the memory controller clock.

11. A memory controller configured to control a memory device, the memory controller comprising:
- a load generator configured to generate a plurality of memory test loads for a plurality of first memory accesses directed to the memory device, the plurality of memory test loads mimicking a plurality of memory access requests for a plurality of second memory accesses from a plurality of second master devices of at least two different device types directed to the memory device, each of the plurality of memory test loads being generated based on a respective device type of the corresponding master device of the plurality of master devices;
- an interface circuit configured to receive the memory test loads from the load generator; and
- processing circuits configured to,
  - receive the memory test loads from the interface circuit, and
  - process the memory test loads such that memory operations associated with the plurality of first memory accesses are performed in the memory device,
- wherein, in response to a test enable signal,
  - the load generator is further configured to output the memory test loads, the memory test loads having a data format equivalent to a data format of the memory access requests from the plurality of master devices, and
  - the interface circuit is further configured to receive the memory test loads from the load generator, without receiving the memory access requests from the plurality of master devices.

12. The memory controller of claim 11, wherein the load generator is further configured to output the memory test loads at a constant bandwidth rate for outputting the memory test loads.

13. The memory controller of claim 11, wherein the processing circuits are further configured to process each of the memory test loads only once.

14. The memory controller of claim 11, wherein the receiving and the processing the memory test loads at the processing circuits are exclusive to receiving and processing the memory access requests at the processing circuits.

15. A method of operating a memory device, the method comprising:
- receiving an enable signal for a test of the memory device;
- generating, by a load generator, a plurality of memory test loads simulating a plurality of memory accesses directed to the memory device from a plurality of master devices of at least two different device types based on the enable signal, the generating the plurality of the memory test loads including outputting the plurality of memory test loads at a constant bandwidth rate, and each of the plurality of the memory test loads is generated on a respective device type of the corresponding master device of the plurality of master devices; and
- processing, by a memory controller of the memory device, the memory test loads, the processing the memory test loads including performing memory operations associated with memory accesses corresponding to the memory test loads.

16. The method of claim 15, wherein the constant bandwidth rate is a maximum bandwidth rate of the memory device.

17. The method of claim 15, further comprising:
- receiving a pattern control signal associated with a data pattern; and
- wherein the generating the memory test loads further comprises generating the memory test loads based on the data pattern indicated by the pattern control signal.

18. The method of claim 15, further comprising:
- blocking memory access to the memory device from a plurality of master devices through a bus based on the enable signal.

19. The method of claim 15, wherein
- the outputting the memory test loads comprises outputting the memory test loads in response to a first clock, where a frequency of the first clock is lower than a frequency of a second clock for operating the memory controller; and
- the processing the memory test loads comprises,
  - buffering data values corresponding to the output memory test loads in a buffer memory, until a data size of the buffered data values reach a reference data size, and
  - processing, in response to the second clock, the buffered data values where the data size has reached the reference data size.

20. The method of claim 19, wherein
- the buffering the data values comprises,
  - increasing, by the load generator, a count value whenever the data values are buffered in the buffer memory, and
  - outputting, by the load generator, a release signal when the count value reaches a reference value;
- the processing the buffered data values comprises processing the buffered data values in response to the release signal; and
- the reference value is associated with the reference data size.

* * * * *